(12) United States Patent
Bousquet et al.

(10) Patent No.: US 12,316,295 B2
(45) Date of Patent: May 27, 2025

(54) METHOD OF FABRICATING LAYERS OF SINGLE-CRYSTAL MATERIAL

(71) Applicant: COMMISSARIAT A L'ENERGIE ATOMIQUE ET AUX ENERGIES ALTERNATIVES, Paris (FR)

(72) Inventors: Marie Bousquet, Grenoble (FR); Pierre Perreau, Grenoble (FR); Alexandre Reinhardt, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 534 days.

(21) Appl. No.: 17/534,289

(22) Filed: Nov. 23, 2021

(65) Prior Publication Data
US 2022/0166398 A1 May 26, 2022

(30) Foreign Application Priority Data

Nov. 26, 2020 (FR) .................................. 2012176

(51) Int. Cl.
*H03H 3/02* (2006.01)

(52) U.S. Cl.
CPC ......... *H03H 3/02* (2013.01); *H03H 2003/021* (2013.01); *H03H 2003/023* (2013.01); *H03H 2003/025* (2013.01)

(58) Field of Classification Search
CPC .............. H03H 3/02; H03H 2003/021; H03H 2003/023; H03H 2003/025; H03H 3/08; H01L 21/185; H01L 21/7806; H10N 30/072; H10N 30/073; Y10T 29/42; Y10T 29/49128
See application file for complete search history.

(56) References Cited

U.S. PATENT DOCUMENTS

| | | | |
|---|---|---|---|
| 6,445,265 B1* | 9/2002 | Wright | H03H 3/10 29/25.35 |
| 6,767,749 B2* | 7/2004 | Kub | H10N 30/072 438/48 |

(Continued)

FOREIGN PATENT DOCUMENTS

| | | |
|---|---|---|
| EP | 2 388 840 A2 | 11/2011 |
| FR | 2 816 445 A1 | 5/2002 |

(Continued)

OTHER PUBLICATIONS

Moreira, et al., "Aluminum scandium nitride thin-film bulk acoustic resonators for wide band applications", Vacuum 86, pp. 23-26, 2011.

(Continued)

*Primary Examiner* — Donghai D Nguyen
(74) *Attorney, Agent, or Firm* — BakerHostetler

(57) ABSTRACT

A process for fabricating a component includes an operation of transferring at least one layer of one or more piezoelectric or pyroelectric or ferroelectric materials forming part of a donor substrate to a final substrate, the process comprising a prior step of joining the layer to a temporary substrate via production of a fragile separating region between the donor substrate of single-crystal piezoelectric or pyroelectric or ferroelectric material and the temporary substrate, the region comprising at least two layers of different materials in order to ensure two compounds apt to generate an interdiffusion of one or more constituent elements of at least one of the two compounds make contact, the fragile region allowing the temporary substrate to be separated.

20 Claims, 32 Drawing Sheets

(56) References Cited

U.S. PATENT DOCUMENTS

| | | | |
|---|---|---|---|
| 8,431,031 B2 | 4/2013 | Pijolat | |
| 8,872,409 B2 * | 10/2014 | Iwamoto | H03H 9/173 |
| | | | 310/345 |
| 8,932,686 B2 * | 1/2015 | Hayakawa | H10N 30/072 |
| | | | 427/523 |
| 9,059,247 B2 * | 6/2015 | Yamazaki | H01L 21/76254 |
| 10,756,254 B2 * | 8/2020 | Tanno | H03H 3/08 |
| 2011/0278993 A1 | 11/2011 | Iwamoto | |

FOREIGN PATENT DOCUMENTS

| | | |
|---|---|---|
| FR | 2 857 983 A1 | 1/2005 |
| FR | 2 953 647 A1 | 6/2011 |
| FR | 3 076 126 A1 | 6/2019 |
| FR | 3 082 997 A1 | 12/2019 |
| IN | 107 800 396 A | 3/2018 |

OTHER PUBLICATIONS

Reinhardt, et al., "Acoustic filters based on thin single crystal LiNbO3 films: status and prospects", Proceedings of the 2014 IEEE International Ultrasonics Symposium, p. 773-781, 2014.

Thomas, "The silicides of transition metals in microelectronics: mechanical properties and stresses induced during solid-phase formation", PlastOx 2007, pp. 277-286, 2009.

Petersson, et al., "Silicides of ruthenium and osmium: thin film reactions, diffusion, nucleation and stability", Journal of Applied Physics, vol. 53, No. 7, pp. 4866-4883, 1982.

* cited by examiner

METHOD OF FABRICATING LAYERS OF SINGLE-CRYSTAL MATERIAL

CROSS-REFERENCE TO RELATED APPLICATIONS

This application claims priority to foreign French patent application No. FR 2012176, filed on Nov. 26, 2020, the disclosure of which is incorporated by reference in its entirety.

FIELD OF THE INVENTION

The field of the invention is that of components comprising at least one layer of piezoelectric or pyroelectric or ferroelectric material, transferred to a final substrate.

In the field of radio-frequency acoustic components able to comprise a piezoelectric layer, mention may be made of the components that allow compact passive filters or resonators having high quality coefficients or high rejection rates, and in which the propagation of elastic waves through solid media replaces propagation of electric waves, to be produced. These filters are most particularly employed in wireless communication systems, in which they allow the many signals collected via the antennas of a communication terminal to be segregated, and thus allow the signal-to-noise-ratio levels required by current telecommunications standards to be achieved.

BACKGROUND

These filters are based on the use of acoustic-wave resonators, which may be divided into three large families:
surface-acoustic-wave (SAW) resonators, which use the propagation of acoustic waves over the surface of a bulk piezoelectric substrate. With this type of substrate, electrodes taking the form of interdigitated combs allow not only these waves to be excited using an electrical signal, but also reciprocally a current that is the image of the waves reaching the electrodes to be generated. By producing reflective structures, resonant cavities may be realized for these surface waves, and thus an electrical resonance achieved;
bulk-acoustic-wave (BAW) resonators for their part use the propagation of acoustic waves through the thickness of a layer of piezoelectric material. Mechanical resonance is obtained when the thickness of the structure is of the order of a half wavelength, or of a multiple of this thickness. Thus, in order to reach the frequencies employed in wireless telephony, these layers must have thicknesses of the order of 1 μm: reference is thus made to thin layers. A resonant cavity is formed by placing an air-filled chamber under the piezoelectric layer, or by using an acoustic mirror that isolates the piezoelectric layer from the substrate serving as carrier of the structure. As for SAW resonators, the mechanical resonance of the structure results in an electrical resonance, given the use of piezoelectric materials.

Lastly, a third type of component is being studied in the academic world: it is a question of plate-mode (or Lamb-wave, or contour-mode, etc.) resonators. In this type of resonator, the propagation of laterally guided waves through a piezoelectric layer is exploited. Just like SAW components, these waves are excited and detected by electrodes taking the form of interdigitated combs. Just like BAW components, the confinement of the waves requires the thin piezoelectric layer acting as waveguide to be isolated via the insertion of an air-filled chamber or of an acoustic mirror between the substrate and the piezoelectric layer.

Whatever the type of resonator in question, the electrical response of the component is described, to the first order, by the so-called Butterworth-Van Dyke (BVD) equivalent circuit, which consists of a capacitor (representing the placement of electrodes about the insulating piezoelectric material) connected in parallel with a series R-L-C electrical resonator (representing the transposition to the electrical domain of the mechanical resonance of the structure). The electrical response of this type of component is therefore above all that of a capacitor, but on which an electrical resonance is superposed. When this resonance occurs, the impedance of the resonator becomes very low, and the latter will therefore be capable of transmitting an electrical signal with a minimum of losses. At a frequency slightly higher than the resonant frequency, an effect occurs that leads to coupling between the static capacitor of the resonator and the resonant branch, which results in an increase of the impedance of the resonator. The latter, at this frequency, becomes capable of blocking the transmission of an electrical signal.

This ability of a resonator to pass one frequency and block another is used to produce a bandpass circuit. The principle of these architectures was theorized in the 1930s. It consists in placing so-called "in-series" resonators on the path of the electrical signal, and other so-called "in-parallel" resonators between the path of the electrical signal and the ground of the circuit. These two sets of resonators are offset in frequency, so that the resonance of the in-series resonators coincides with the anti-resonance of the in-parallel resonators. This ensures the transmission of the signal from the input to the output of the circuit, at this frequency, which is called the central frequency. At the resonant frequency of the in-parallel resonators, the latter short-circuit the component, and block any transmission of the signal, making the filter block the signal. At the anti-resonant frequency of the in-series resonators, the latter behave as open circuits, and therefore prevent the passage of the signal. Thus, the circuit passes the signal in the vicinity of the central frequency, and blocks it at other frequencies. The width of the passband of the filter is therefore dependent on the relative spacing between the resonant and anti-resonant frequencies of the resonators from which it is composed. Now, this spacing is quantified by a so-called electromechanical coupling coefficient ($k^2$), which moreover quantifies the fraction of energy able to be converted from the electrical domain to the mechanical domain, or vice versa, within a resonator in each period of oscillation. This coefficient depends directly on the geometry of the resonator, on the type of wave exploited, but also on the piezoelectric properties of the employed material.

The increase in the rates of transmission of data has led to greater needs in terms of bandwidth. Such bandpass filters must therefore be based on acoustic resonators possessing increasingly high electromechanical coupling coefficients.

Historically, passbands of the order of 2 to 3% in relative width required resonators possessing electromechanical coupling coefficients of the order of 5 to 6%. Currently, these bands tend toward relative widths of the order of 4%, requiring coupling coefficients approaching 8%. Opening frequency bands to higher frequencies allows the needs in terms of relative passband to be relaxed. Nevertheless, resonant structures cannot be scaled exactly to follow the increase in frequency, this leading to conditions that are unfavourable to the development of high electromechanical coupling coefficients. Similarly, multiplication of frequency bands leads to cluttering of the radio spectrum, this leading to a decrease in the frequency margins available between the various bands. This leads to the need for filters having high rejection rates at the edge of the passband, but also frequency dispersions (due to manufacturing tolerances and to drifts related to environmental sensitivities) that are low. The response of filter manufacturers to this state of affairs has been to introduce resonator structures that are temperature-compensated in order to exhibit drifts in frequency as a function of temperature that are lessened, or even decreased to zero. These structures however require the addition of layers of materials ensuring a compensation for temperature effects inside the resonant structure, this sometimes being accompanied by a decrease in electromechanical coupling coefficients. The only means under these conditions of keeping these coupling coefficients at an acceptable level consists in turning to materials possessing improved piezoelectric properties.

Lastly, the last few years have seen the emergence of concept frequency-agile resonators, i.e. resonators possessing electrically controllable resonant frequencies. Adequate agility is however obtained by trading some of the original electromechanical coupling coefficient of the resonator for a range of relative variation in frequency. Thus, once again, materials possessing improved piezoelectric properties are required.

Surface-wave components are generally produced from single-crystal substrates of piezoelectric materials such as lithium tantalate or niobate ($LiTaO_3$ or $LiNbO_3$), quartz ($SiO_2$), potassium niobate ($KNbO_3$), langasite ($La_3Ga_5SiO_{14}$), and langatate ($La_3Ga_{5.5}Ta_{0.5}O_{14}$). Privileged crystal orientations have been determined for these materials in order to achieve, as regards surface waves, electromechanical coupling coefficients that are compatible with the requirements in terms of filter synthesis (from 4 to 7%), while attempting to keep drifts in frequency with temperature at acceptable levels (of the order of 40 ppm/K). As regards plate- or bulk-wave components, the latter have mainly been developed using aluminium nitride (AlN) as piezoelectric material. Specifically, techniques for depositing thin layers of this material are now well-established, and allow electromechanical coupling coefficients between 6 and 7% to be achieved for bulk waves, and drifts in frequency with temperature, without compensation, of the order of 30 to 35 ppm/K. Over the last few years, the development of solid-state solutions derived from this material ($Sc_xAl_{1-x}N$ in particular) have allowed electromechanical coupling coefficients to be increased to up to 12% with scandium concentrations of the order of 15%, without requiring major modification of existing technologies (Moreira, *Aluminum scandium nitride thin-film bulk acoustic resonators for wide band applications*, Vacuum 86, 23 (2011)).

Nevertheless, these increases are not yet sufficient to allow frequency-agile filtering solutions to be developed. For this reason research is currently being directed toward the use of thin layers of lithium tantalate or niobate in applications of bulk-wave or plate-wave filters. Specifically, certain crystal orientations allow electromechanical coupling coefficients of up to 45% to be obtained, and would therefore in theory allow relative frequency agilities of the order of 10 to 20% (A. Reinhardt, *Acoustic filters based on thin single crystal $LiNbO_3$ films: status and prospects*, Proceedings of the 2014 IEEE International Ultrasonics Symposium, p. 773-781).

However, this would require lithium niobate to be available in the form of high-quality single-crystal substrates. However, this material is extremely difficult to synthesize in thin-layer form. Specifically, its crystallization requires extremely high temperatures (≥600° C.), while its very high coefficients of expansion make it liable to generate thermoelastic stresses that are so high that such films may rapidly exhibit cracking or delaminate.

Moreover, control of the stoichiometry of such films and of their crystal quality still remains problematic. In addition, the crystal orientations preferred for the generation of waves exhibiting high electromechanical coupling coefficients do not correspond to the main axes of symmetry, making it almost impossible to grow films with optimal properties epitaxially. Furthermore, epitaxy of this material is incompatible with the presence of metal electrodes under the film, as required in bulk-acoustic-wave resonators or certain forms of plate-wave resonators.

Up to now, the way in which thin layers of single-crystal materials having a defined crystallographic orientation have been produced has consisted in using techniques for transferring thin layers. Patent FR 2 953 647 (U.S. Pat. No. 8,431,031 B2) describes a process allowing a bulk-wave resonator to be produced using such a technique, but it may equally well be used to produce plate-wave resonators. An example of a production process using this technique will now be described with reference to FIGS. 1A to 1H.

Steps 1 and 2, which are Illustrated in FIG. 1A:
    light ions are implanted into a lithium-niobate substrate 10 in order to form a layer containing crystal defects 11;
    a metal, for example AlSi, is deposited by sputtering, then photolithography, wet etching and resist removal are carried out in order to form a set of lower electrodes 12;

Step 3, which is Illustrated in FIG. 1B:
    a sacrificial active layer 13 is deposited and structured in order to form a releasing well located under the active region of each resonator;

Step 4, which is Illustrated in FIG. 1C:
    a bonding layer 14 is deposited then planarized by chemical-mechanical polishing in order to have a planar surface compatible with direct bonding;

Steps 5, 6 and 7, which are Illustrated in FIG. 1D:
    on a second substrate, called the receiver substrate 20, a bonding layer is deposited; the donor substrate 10 is bonded to the receiver substrate 20 by direct bonding; an annealing step is carried out to consolidate the bond.

Steps 8 and 9, which are Illustrated in FIG. 1E:
    a heat treatment intended to cause implantation defects to ripen in the substrate 10 is carried out, until the latter splits;
    a chemical-mechanical polishing operation is carried out in order to remove post-splitting roughness and to adjust the final thickness of the transferred piezoelectric layer.

Step 10, which is Illustrated in FIG. 1F:
    upper electrodes 21 are deposited and structured;

Step 11, which is Illustrated in FIG. 1G:
    photolithography, ion-beam etching and resist-removal operations are carried out to form through-apertures in the transferred film 10, allowing electrical contact redistribution to the lower electrode 12 or access to the sacrificial layer 13.

Step 12, which is Illustrated in FIG. 1H:
    the resonator structure is released by chemically etching the silicon with gaseous $XeF_2$.

This fabricating process allows functional components to be obtained. Nevertheless, the implantation of gaseous species into the crystal, with a view to allowing the latter to be split, generates many defects in the crystal structure. After splitting (step 8), some of the implanted ions remain present in the crystal in which they generate local stresses, and deform the crystal structure, leading to a decrease in the macroscopic piezoelectric properties of the layer. Some of these residual defects are removed in the chemical-mechanical polishing (step 9), but this is far from being sufficient. It is therefore necessary to apply healing treatments to the bulk of the layer, i.e. to apply treatments such as a heat treatment to the transferred layer, in order to remove residual implantation/splitting defects (in particular due to exodiffusion of gas species). These treatments must necessarily raise the sample to a temperature above the splitting temperature, i.e. to above 300° C., but remain far below the Curie point of the material (which is approximately 1140° C. for $LiNbO_3$, and 602° C. for $LiTaO_3$) in order not to cause a change of phase (ferroelectric→paraelectric) which would result in disorientation of the ferroelectric domains established in the crystal, and thus remove any macroscopic piezoelectricity. Otherwise a poling step, which consists in applying an electric field higher than the coercive field ($E_c$=180 kV/cm for $LiNbO_3$, and 160 kV/cm for $LiTaO_3$), is then required in order to reorientate the ferroelectric domains and therefore obtain a macroscopic piezoelectric character.

The Applicant has studied the influence of anneals at 350° C. and at 400° C., both carried out for 2 hours. This study revealed the presence of defects in bubble form extending to a depth of more than 100 nm in the case of an anneal at 350° C., and 50 nm in the case of an anneal at 400° C. Clearly, an anneal at 400° C. for 2 hours is insufficient to remove residual implantation defects, and thus to allow the piezoelectric material to be healed. A higher temperature and/or a longer annealing time would have to be applied.

It should however be noted that, in the production process presented above, the anneal for healing implantation defects is carried out at a point when the stack already has a certain heterogeneity. In particular, lower electrodes made of aluminium (or aluminium-silicon or aluminium-copper) are present under the transferred lithium-niobate layer. This metal has a melting point of about 660° C., and a coefficient of expansion (~13 ppm/° C.) higher than that of certain crystal orientations of lithium niobate. These two conditions lead to the appearance of high strains in the material on application of high thermal budgets, leading to the formation of hillocks that result from mechanical effects that are internal to the metal film. Such hillocks, as may for example be seen in FIGS. 2A and 2B [which relate to observations by atomic-force microscopy of the surface of a thin aluminium layer deposited on a lithium-niobate substrate after deposition (FIG. 2A) and after annealing at 400° C. for 2 hours (FIG. 2B)], lead to an increase in the roughness of the film and possibly lead to electrical defectiveness when these hillocks grow inside an adjacent layer.

This effect is very well known in the world of microelectronics. From the point of view of the electrical response of the resonator, the impact of annealing may be seen in FIGS. 3A and 3B, which relate to the impact of annealing on the electrical response of a bulk-wave resonator made of lithium niobate, and show the modulus of its admittance (FIG. 3A) and the phase of its impedance (FIG. 3B). The dashed curves and thick solid curves correspond to a resonator produced from a layer of lithium niobate annealed at 350° C. and 400° C., respectively, the same resonator being produced on two different samples, one being annealed at 350° C. and the other at 400° C. The degradation of the quality coefficient of the sample the layer of which was annealed at higher temperature is the main thing to note. This is mainly attributable to the degradation of the lower electrode.

To circumvent this problem, it is possible to envisage using other metal electrodes. Specifically, materials such as platinum or palladium are often used as electrodes for piezoelectric materials synthesized at high temperature, such as $PbZr_xTi_{1-x}O_3$ for example, or in applications of sensors required to operate at high temperatures (above 400° C.). Nevertheless, these materials have the drawback of having a high resistivity and of generating great mechanical losses, this degrading quality coefficient even more than the degradation of aluminium electrodes. Moreover, these materials adhere weakly to lithium niobate, or to the silicon oxide used as a bonding layer, and as a result delaminations occur. This may be overcome by inserting adhesion layers, but the latter may easily oxidize in contact with lithium tantalate or niobate, this resulting in the formation of interface capacitors and the formation of oxygen vacancies in the piezoelectric material. These two effects result in a decrease in the piezoelectric properties of the material, and in leakage currents that are detrimental to the application in question, respectively.

Generally, all the materials providing an acceptable compromise between mechanical and electrical properties are sensitive to high-temperature anneals in one way or another (oxidation, strain, recrystallization, etc.). Thus, it is therefore necessary to modify the process for fabricating these resonators to avoid the layers present (metals, sacrificial layer) from having to undergo the high-temperature anneals required to heal implantation defects in the lithium niobate.

Another issue related to the process described above relates to management of differences in coefficient of thermal expansion between the materials present. Specifically, lithium niobate possesses coefficients of expansion of the order of 5 to 10 times higher than silicon. Furthermore, its expansion is anisotropic. Thus, in the splitting anneal already, the deformations of the stack composed of the bonded-together donor substrate and receiver substrate may become extremely large and lead either to debonding, or, if the bonding energy is sufficiently high, to mechanical breakage of the structure. For this reason, the process currently used consists solely in transferring a lithium-niobate film to a lithium-niobate substrate (homostructure transfer). An approach consisting in transferring a lithium-niobate film to silicon (heterostructure transfer) at the current time still remains tricky to carry out reproducibly. This prevents the production of components on fabrication lines dedicated to silicon substrates, complicates the production process, and in some respects decreases options in terms of available technologies. It is therefore necessary to develop the existing production process in order to allow thin single-crystal layers to be transferred to a silicon substrate.

Lastly, in the current process, the layers from which the lower electrode is made, the releasing wells and the bonding layer require low-temperature deposition, i.e. deposition at temperatures below the splitting temperature, in order not to cause implantation defects to ripen, which could result in an exfoliation of the surface due to premature splitting of the donor substrate. In practice, the depositions carried out before the splitting step are limited to a temperature of approximately 150° C. This limits the choice of the usable production processes, and to a certain extent the quality of the materials employed. For example, the electrodes used are not or not very crystallized and textured, this possibly resulting in the components having a limited power withstand. A second potential problem resides in the deposition of insufficiently dense layers of silicon oxide, which may therefore absorb moisture or even contain gases as a result of the deposition process (mainly Ar). During high-temperature healing anneals, these trapped gases may potentially cause the appearance of bubbles, or even pierce the stack in order to allow the gas to escape. Lastly, in the case where it is desired to add a passivating layer in order to protect the component from the exterior environment, said layer runs the risk of not being dense enough to play its role as a barrier to ambient moisture and/or oxygen. Component reliability is therefore still limited at the current time. It would therefore also be desirable to modify the fabricating process in order to no longer be subject to a limitation in terms of thermal budget as regards the deposition of the first layers of the stack.

SUMMARY OF THE INVENTION

Hence, one subject of the present invention is a process for fabricating a component comprising transferring an assembly comprising one or more layers of one or more single-crystal piezoelectric or pyroelectric or ferroelectric materials to a final substrate, said process comprising at least:
- a first set of steps comprising:
  - a step of implanting ions into a donor substrate of single-crystal piezoelectric or pyroelectric or ferroelectric material at an implantation level so as to define a layer region in said single-crystal piezoelectric or pyroelectric or ferroelectric material;
  - a first joining step in which said donor substrate of single-crystal piezoelectric or pyroelectric or ferroelectric material is joined to a temporary substrate, said first joining step comprising producing a fragile separating interface region between said donor substrate of single-crystal piezoelectric or pyroelectric or ferroelectric material and said temporary substrate, said region comprising at least two layers of different materials in order to ensure two compounds apt to generate an interdiffusion of one or more constituent elements of at least one of the two compounds make contact;
  - a step of thinning said donor substrate of single-crystal piezoelectric or pyroelectric or ferroelectric material to the implantation level so as to define a layer of single-crystal piezoelectric or pyroelectric or ferroelectric material;
  - a step of healing residual defects via thermal annealing of said layer of single-crystal piezoelectric or pyroelectric or ferroelectric material;
- and a second set of steps subsequent to the first set of steps, comprising at least:
  - a second joining step in which an assembly comprising the one or more layers of one or more single-crystal piezoelectric or pyroelectric or ferroelectric materials and said temporary substrate is joined to a final substrate;
  - a step of separating the temporary substrate from said layer of single-crystal piezoelectric or pyroelectric or ferroelectric material, via said fragile separating interface region.

By "interdiffusion of one or more constituent elements of at least one of the two compounds", what is meant is a chemical diffusion between the two layers of the fragile interface region. This chemical diffusion allows compounds to be exchanged between these two layers, this tending to increase the uniformity of the composition of said two layers in said fragile interface region.

According to variants of the invention, the second set of steps comprises a step of producing a first functional structure on one of the layers of single-crystal piezoelectric or pyroelectric or ferroelectric material.

According to variants of the invention, the second set of steps comprises a step of producing a second functional structure on one of the layers of single-crystal piezoelectric or pyroelectric or ferroelectric material.

According to variants of the invention, after the step of thinning said donor substrate, which is made of a first single-crystal piezoelectric or pyroelectric or ferroelectric material, to the implantation level, so as to define a layer of single-crystal piezoelectric or pyroelectric or ferroelectric material, said process comprises producing an additional layer of second single-crystal piezoelectric or pyroelectric or ferroelectric material on the surface of said layer of single-crystal piezoelectric or pyroelectric or ferroelectric material, said first and second materials possibly being identical or different.

According to variants of the invention, the thickness of the layer of first material is smaller than or equal to 1 micron, and the thickness of the additional layer of second material is larger than a plurality of microns.

According to variants of the invention, production of said fragile separating interface region between said donor substrate of single-crystal piezoelectric or pyroelectric or ferroelectric material and said temporary substrate comprises at least:
- producing a layer of oxide or of nitride;
- depositing a layer of noble metal;
- carrying out a thermal anneal apt to create said interdiffusion of one or more constituent elements of at least one of the two compounds.

According to variants of the invention, the process comprises:
- producing a layer of silicon oxide or of silicon nitride;
- depositing a layer of noble metal of Pt or of Au or of Rh or of Os or of Pd or of Ru or of Ir.

According to variants of the invention, the step of healing residual defects via thermal annealing is carried out with a thermal budget apt to cause the diffusion of the noble metal into the oxide or into the nitride, said thermal budget possibly being spent at a temperature comprised between 300° C. and 700° C. for a time comprised between 1 hour and 10 hours.

According to variants of the invention, the first joining step, in which step said substrate of single-crystal piezoelectric or pyroelectric or ferroelectric material is joined to a temporary substrate, is carried out with a first bonding layer made of a constituent material of one of the materials in order to ensure two compounds apt to generate an interdiffusion of one or more constituent elements of at least one of the two compounds make contact.

According to variants of the invention, the first joining step, in which step said substrate of single-crystal piezoelectric or pyroelectric or ferroelectric material is joined to a temporary substrate, is carried out with a first bonding layer, said first bonding layer possibly being a layer of silicon oxide ($SiO_2$), a metal layer (Cu, Au, Ti, Ag, etc.) or a layer of a polymer such as benzocyclobutane (BCB).

According to variants of the invention, the second joining step, in which step an assembly comprising the one or more layers of one or more single-crystal piezoelectric or pyroelectric or ferroelectric materials and said temporary substrate is joined to a final substrate, is carried out with at least one second bonding layer, said second bonding layer possibly being mineral, and possibly being made of $SiO_2$ or of $SiO_xN_y$.

According to variants of the invention, the step of separating the temporary substrate is carried out mechanically, via the fragile interface.

According to variants of the invention, the donor substrate of single-crystal piezoelectric or pyroelectric or ferroelectric material is made of lithium niobate, or lithium tantalate.

According to variants of the invention, the temporary substrate is of the same nature as the donor substrate of single-crystal piezoelectric or pyroelectric or ferroelectric material.

According to variants of the invention, the final substrate is made of a material such as lithium niobate, lithium tantalate or silicon or glass or sapphire.

According to variants of the invention, the fabricating process comprises:
- producing a first metal functional structure on a first face of said layer of single-crystal piezoelectric or pyroelectric or ferroelectric material, said structure being configured to be a continuous electrode or a series of discontinuous electrodes;
- producing a second metal functional structure on the opposite face of said layer of single-crystal piezoelectric or pyroelectric or ferroelectric material or on an opposite face of another layer of single-crystal piezoelectric or pyroelectric or ferroelectric material, said structure being configured to be a continuous electrode or a series of discontinuous electrodes, said first face corresponding to the thinned face of the donor substrate of single-crystal piezoelectric or pyroelectric or ferroelectric material.

According to variants of the invention, the component being an acoustic-wave resonator, said process comprises:
- depositing a sacrificial layer on the surface of a layer of single-crystal piezoelectric or pyroelectric or ferroelectric material or on the surface of the additional layer of second single-crystal piezoelectric or pyroelectric or ferroelectric material and/or on the surface of the first metal functional structure, said sacrificial layer for example possibly being made of amorphous silicon;
- producing at least one well in said sacrificial layer;
- etching said well so as to produce a suspended membrane of single-crystal piezoelectric or pyroelectric or ferroelectric material.

According to variants of the invention, the component being an acoustic-wave resonator, said process comprises producing cavities in said final substrate before the second joining step.

According to variants of the invention, the component being an acoustic-wave resonator, said process comprises producing a stack with, in alternation, layers having low acoustic impedances and layers having high acoustic impedances (for example, $SiO_2/W$, or $SiO_2/Mo$, or $SiO_2/AlN$ or SiOC/SiN, etc.), on the surface of the layer of single-crystal piezoelectric or pyroelectric or ferroelectric material or on the surface of the additional layer of second single-crystal piezoelectric or pyroelectric or ferroelectric material, in order to produce a Bragg-mirror structure.

According to variants of the invention, the component comprising a set of at least two stacked bulk-acoustic-wave resonators, the process comprises:
- fabricating a resonator comprising at least a first layer of single-crystal piezoelectric or pyroelectric or ferroelectric material, a first metal functional structure, and a second metal functional structure, on a final substrate;
- depositing one or more acoustically coupling or isolating layers on the surface of said first resonator;
- producing a first metal functional structure apt to form a first electrode of a second resonator on the surface of said one or more acoustically coupling or acoustically isolating layers;
- transferring a second layer of single-crystal piezoelectric or pyroelectric or ferroelectric material previously transferred, to a temporary substrate, via a fragile separating interface region to the surface of said temporary substrate;
- removing said temporary substrate so as to leave a second face of said second active layer free;
- producing a second metal functional structure, so as to define the second resonator.

According to variants of the invention, the component being a pyroelectric sensor comprising, between two continuous electrodes, an active layer, the layer of single-crystal piezoelectric or pyroelectric or ferroelectric material possibly being made of lithium tantalate, said process further comprises partially etching, from the back side, the final substrate so as to define a membrane in said final substrate, said final substrate possibly being made of silicon.

According to variant embodiments, the fragile interface region comprises a layer of noble metal and another layer comprising at least one of the following materials:
- an oxide;
- a nitride;
- a silicon oxynitride;
- a silicon oxycarbide (SiOC);
- SiOF.

By "noble metal", what is meant is a metal that resists corrosion and oxidation. Such metals are for example: gold, silver, platinum, palladium, iridium, radium, osmium, ruthenium, copper, rhenium, mercury, stainless steels, titanium, zirconium, tantalum.

BRIEF DESCRIPTION OF THE DRAWINGS

Other features and advantages of the invention will become apparent with the aid of the following description, given with reference to the appended drawings in which.

DETAILED DESCRIPTION

Figure 1A:
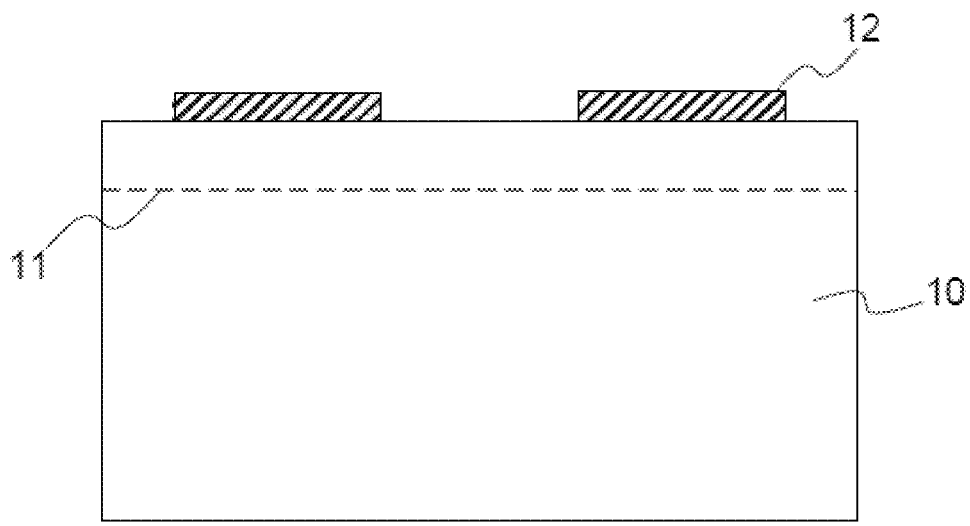
FIG. 1A illustrates one step of a process according to the prior art.
Figure 1B:
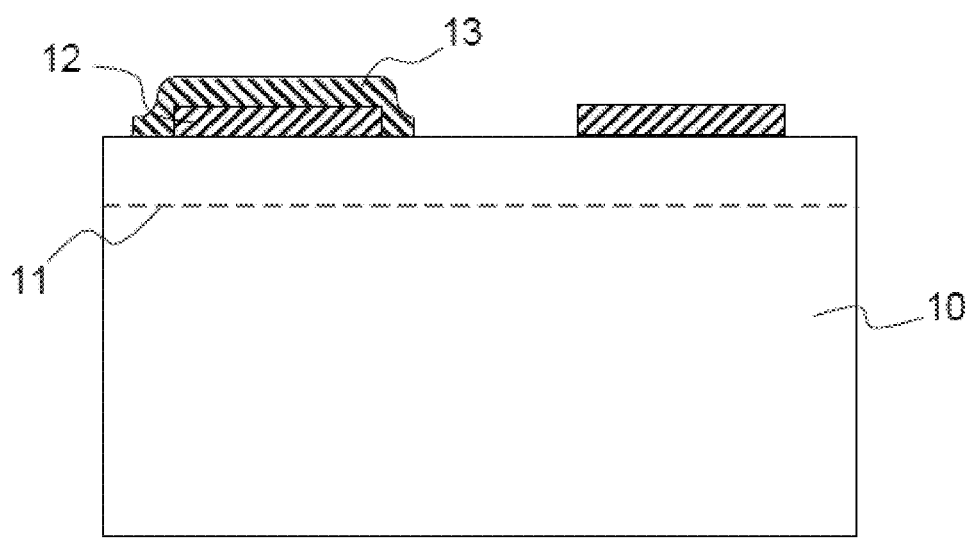
FIG. 1B illustrates one step of a process according to the prior art.
Figure 1C:
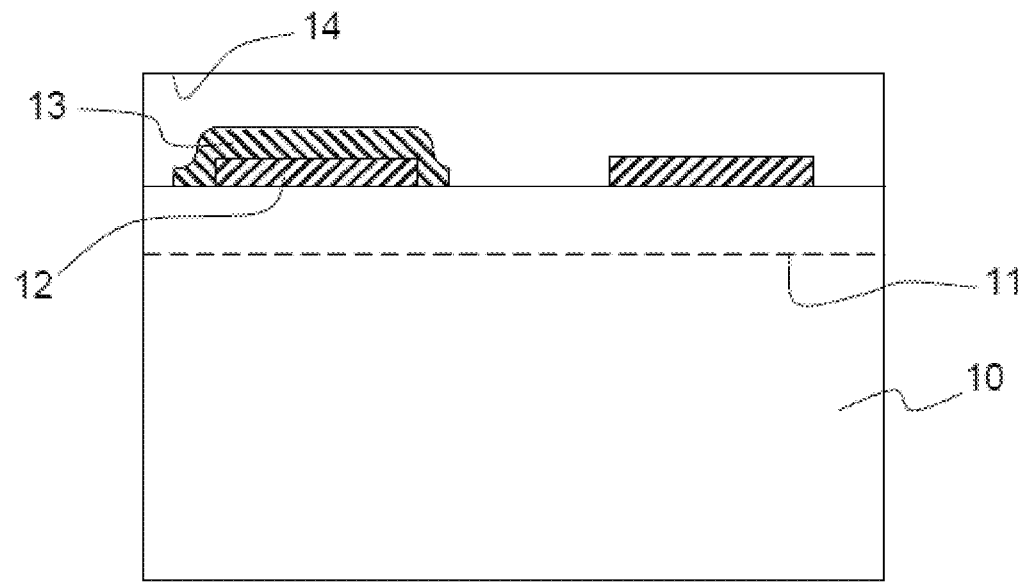
FIG. 1C illustrates one step of a process according to the prior art.
Figure 1D:
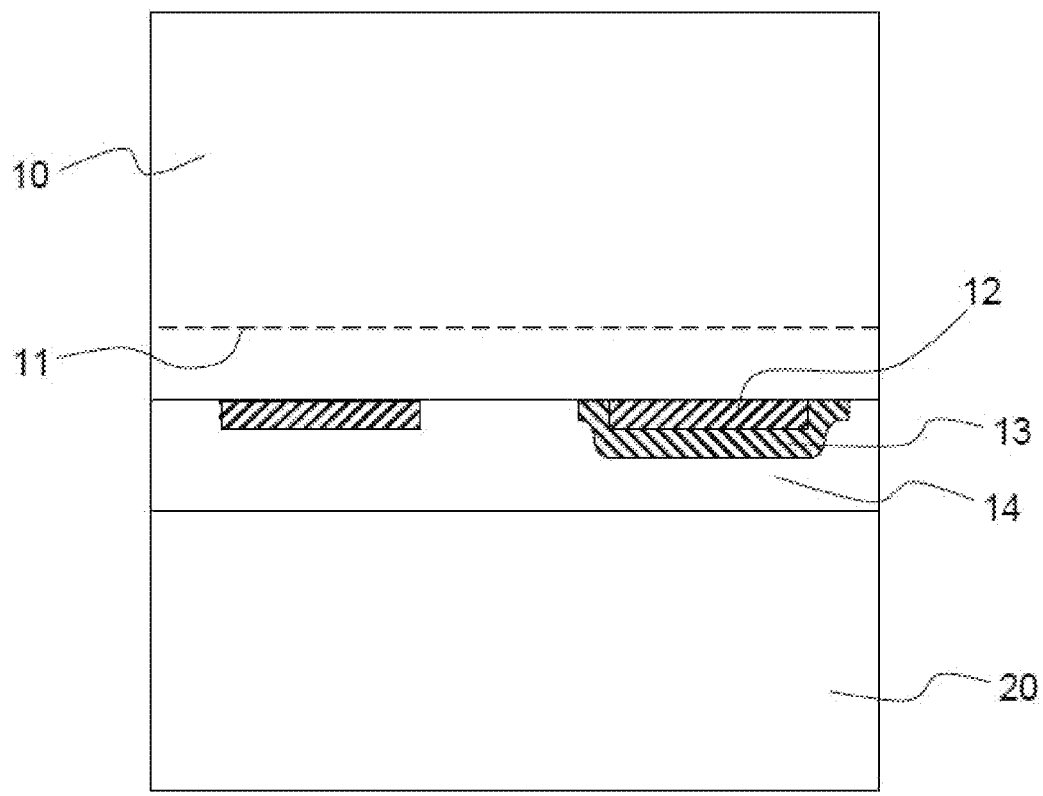
FIG. 1D illustrates one step of a process according to the prior art.
Figure 1E:
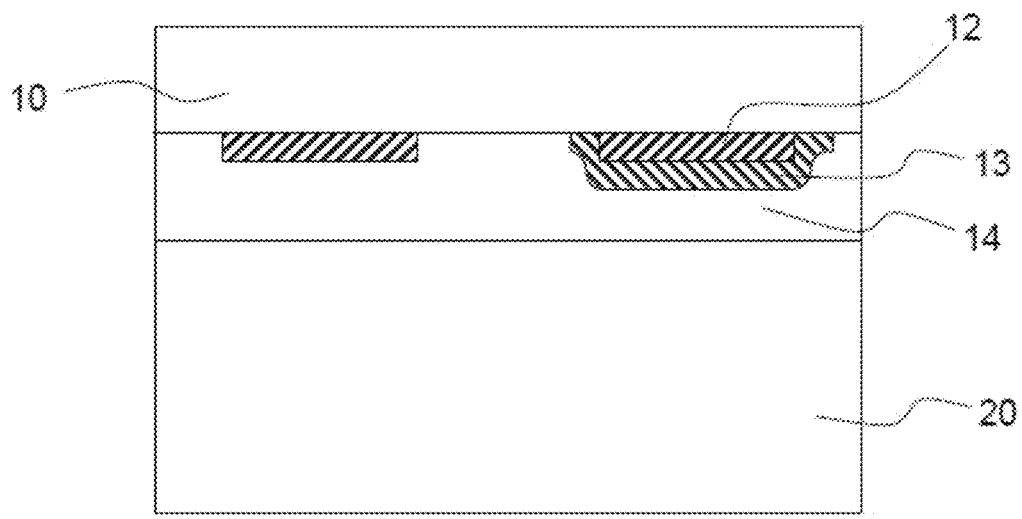
FIG. 1E illustrates one step of a process according to the prior art.
Figure 1F:
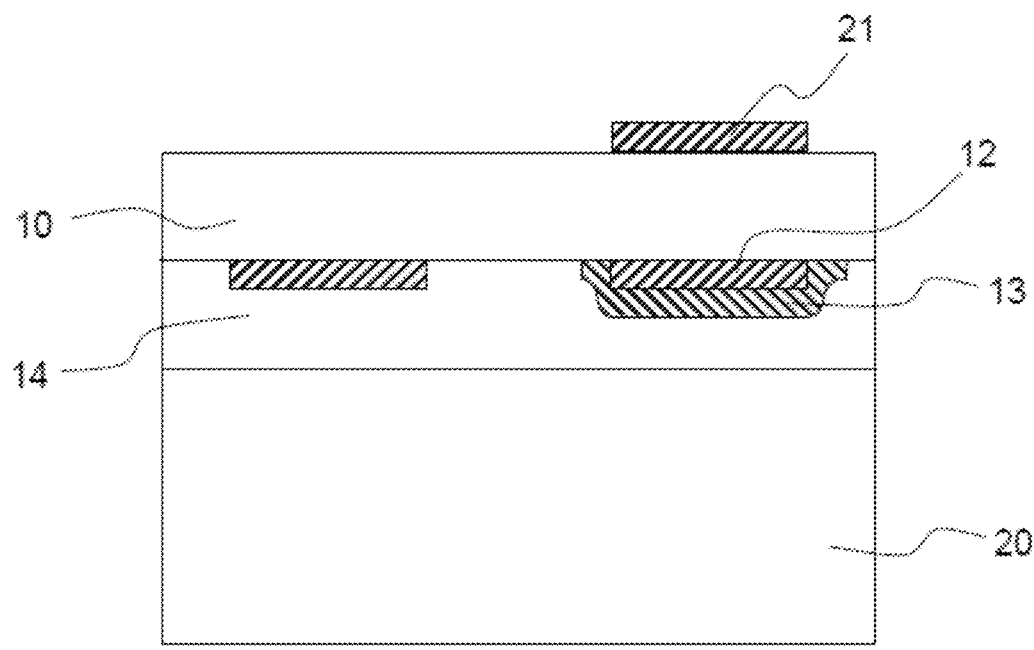
FIG. 1F illustrates one step of a process according to the prior art.
Figure 1G:
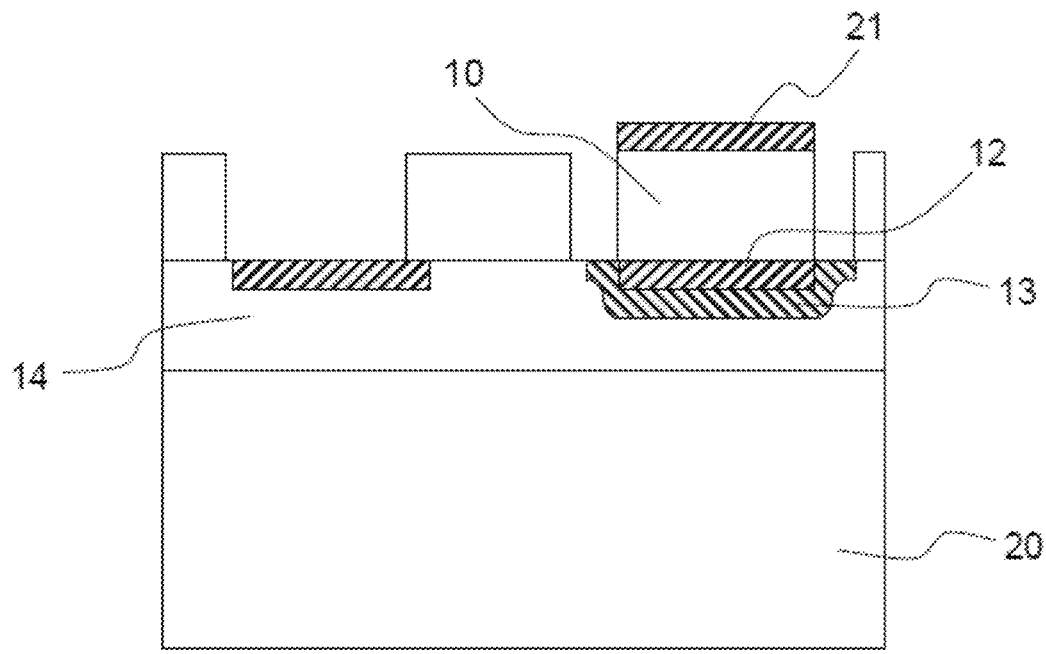
FIG. 1G illustrates one step of a process according to the prior art.
Figure 1H:
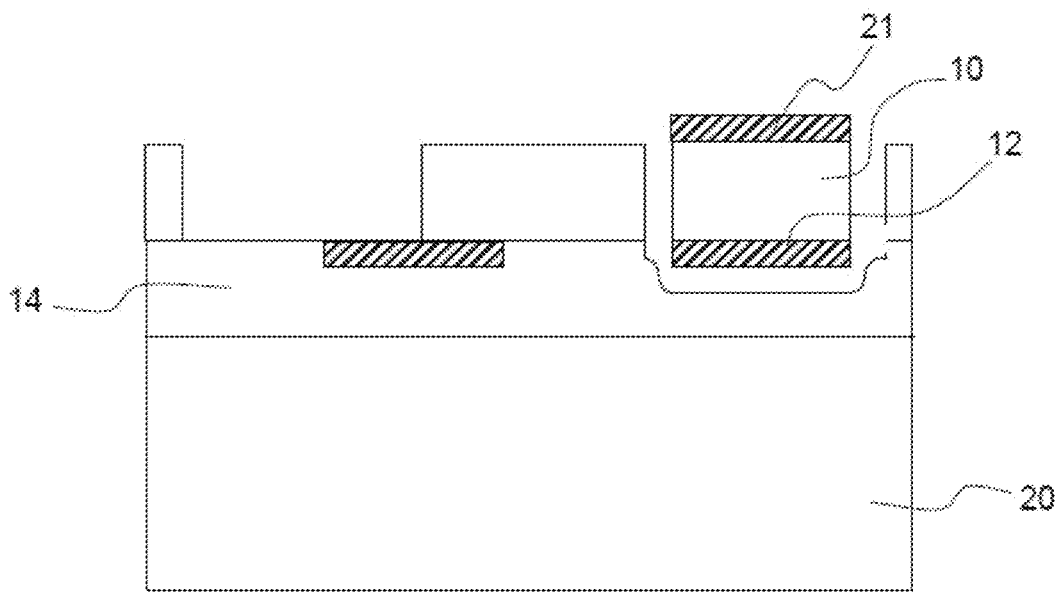
FIG. 1H illustrates one step of a process according to the prior art.
Figure 2A:
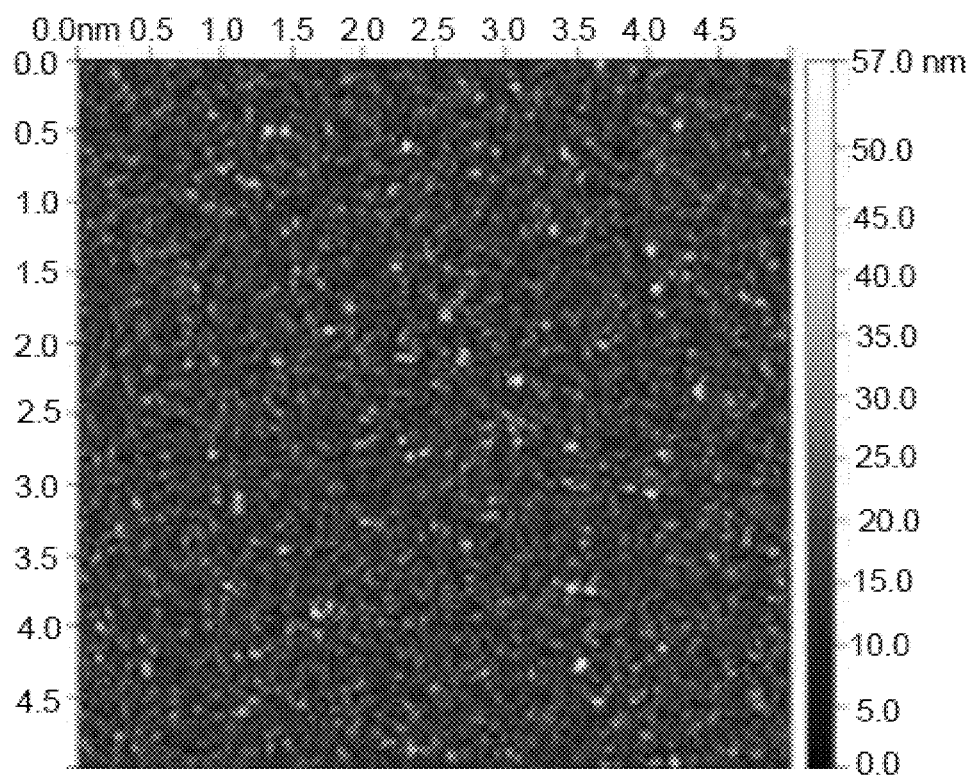
FIG. 2A illustrates atomic-force-microscopy observations of the surface of a thin aluminium layer deposited on a lithium-niobate substrate after deposition.
Figure 2B:
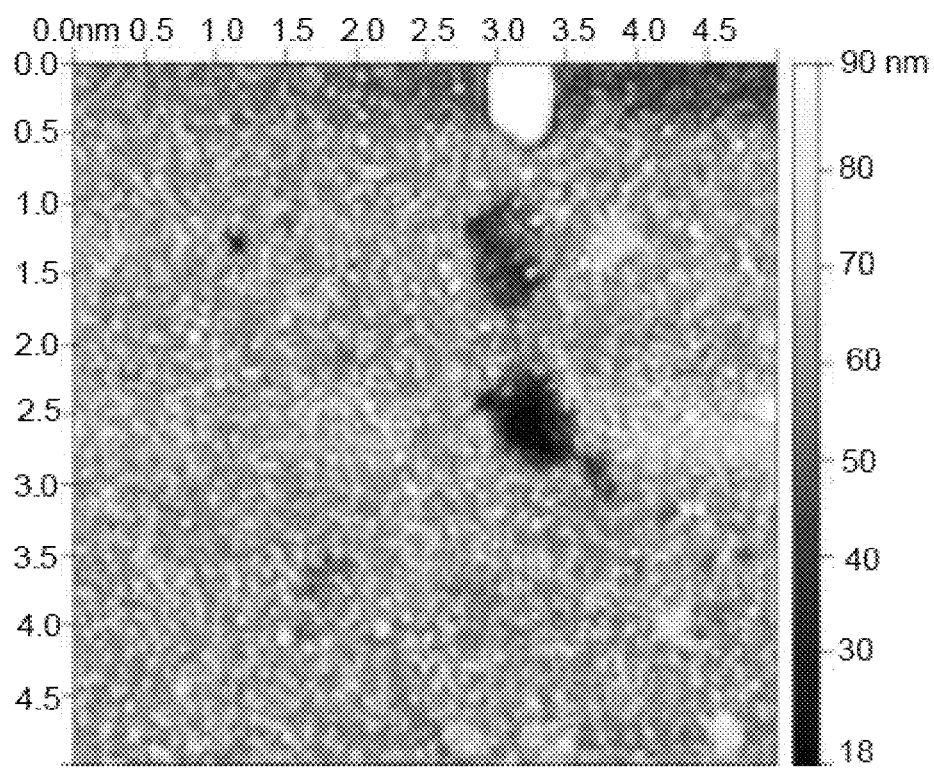
FIG. 2B illustrates atomic-force-microscopy observations of the surface of a thin aluminium layer deposited on a lithium-niobate substrate after annealing at 400° C. for 2 hours.
Figure 3A:
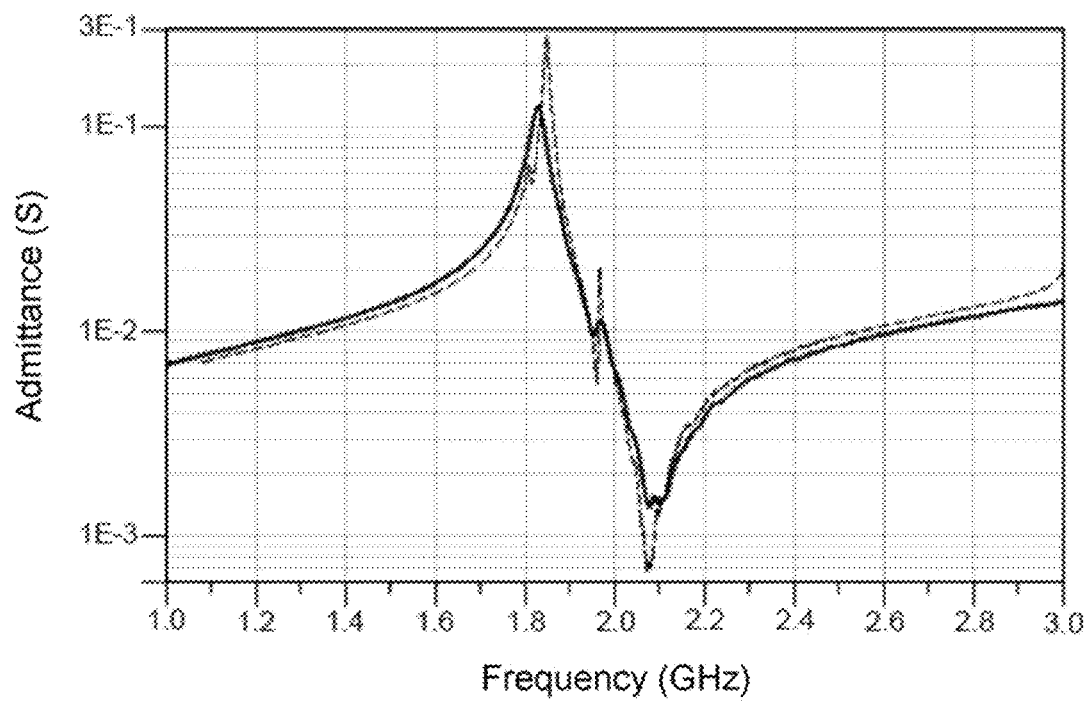
FIG. 3A illustrates the impact of an anneal on the electrical response of a bulk-wave resonator made of lithium niobate (modulus of the admittance)
Figure 3B:
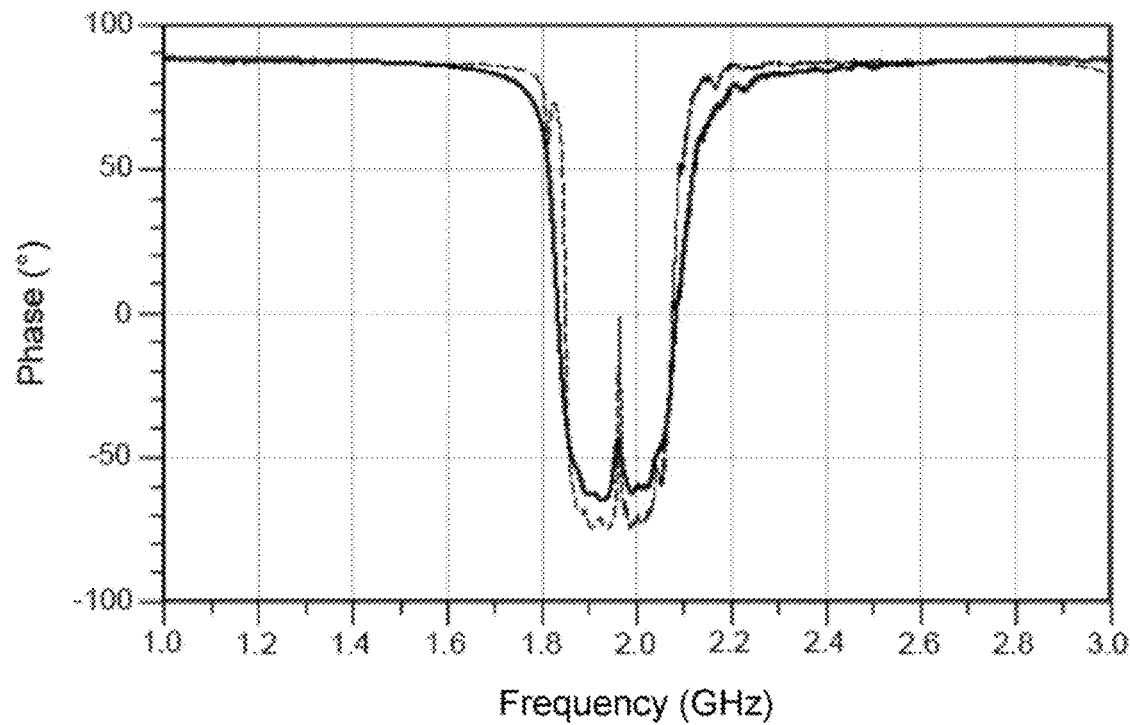
FIG. 3B illustrates the impact of an anneal on the electrical response of a bulk-wave resonator made of lithium niobate (phase of the impedance). The dashed curve and the thick, solid curve correspond to a resonator produced from a lithium-niobate layer annealed at 350° C. and 400° C., respectively.

Generally, to overcome the issues presented in the preamble, the Applicant proposes to separate the issues and to construct the final component sequentially using an original transferring process. Thus, the process for fabricating the component may in particular comprise all of the following steps:

Step 1: creating a weakened region by implanting ions into a piezoelectric or pyroelectric or ferroelectric material that it is desired to transfer, depositing a bonding layer, which may be a layer of silicon oxide ($SiO_2$), and activating the bonding layer via a treatment consisting of a chemical-mechanical polishing (CMP) treatment and/or a plasma activation. A root-mean-square (RMS) roughness lower than 5 Å is preferred. This bonding layer may also be deposited and planarized before the ion implantation.

Step 2: transferring the piezoelectric or pyroelectric or ferroelectric layer to a temporary substrate, this comprising producing a fragile separating interface region that allows this piezoelectric or pyroelectric or ferroelectric layer to be subsequently detached from the temporary substrate. This fragile separating interface region may advantageously consist of a stack of at least two materials that, placed in contact, naturally have a low force of adhesion at this interface.

Step 3: healing defects caused by the splitting and ion implantation. This is achieved via a polishing step and an anneal (or an anneal followed by a polishing step). At this stage, the means for detaching the transferred film must be capable of withstanding the applied thermal budget.

Step 4: producing low levels (lower electrode; sacrificial-layer wells; where appropriate, temperature-compensating layer and passivating layer; or even addition of lower over-metallizations; etc.).

Step 5: depositing a bonding layer, and planarizing the latter.

Step 6: bonding this stack to the ultimate host substrate.

Step 7: separating the temporary substrate via the fragile separating interface region.

Step 8: removing any layers incorporated into the temporary substrate.

Step 9: continuing the production process by adding upper levels (etching apertures in the transferred film, upper electrodes, temperature-compensating layer, passivating layer, over-metallizations, etc.).

Proceeding in this way allows a high thermal budget to be applied to the temporary substrate without degrading the functional layers present and thus an integral stack to be achieved. Moreover, the following steps may be carried out up to temperatures equal to those of the healing anneal. The limitation as regards thermal budget, which limitation is related to the presence of implantation defects that are liable to cause premature exfoliations, is removed, this allowing thin layers that are much denser and of much better acoustic quality to be achieved.

The present invention is based on techniques that are known in the art: for example all of the techniques presented in patent FR 2 816 445, which has already disclosed techniques for transferring single-crystal layers by splitting to a temporary substrate, then transferring the transferred layer to an ultimate host substrate. Nevertheless, the present invention differs therefrom in that the Applicant proposes to include, in these techniques, a fragile separating interface region.

Patent US 2011/0278993A1 also discloses a process that is quite similar to the process that is the subject of the present invention: it describes producing surface- or bulk-acoustic-wave components composed of a single-crystal piezoelectric film transferred beforehand using the sequence of steps, steps 1-9, described above. In step 2 described above, this patent proposes to insert a dielectric layer between the transferred layer and a substrate made of a material that induces, at the interface between the temporary substrate and the piezoelectric substrate, a thermal stress that is lower than the stress between the carrier substrate and the thin piezoelectric film. After the various lithography and integration levels of the thin piezoelectric layer (steps 3-6 described above) have been carried out, the temporary substrate is removed via a selective (physical or chemical) etch of the layer (e.g.: ZnO, $SiO_2$, AlN, Cu, Al, Ti or polyimide) located between the thin piezoelectric film and the temporary substrate. Although the thickness of this sacrificial layer is not mentioned, it is thinkable that the latter is removed by chemical infiltration and/or mechanical lapping of the temporary substrate. These two techniques may rapidly prove to be prohibitive in terms of treatment duration and/or fabrication cost.

The process that is the subject of the present invention differs from the teaching of patent US 2011/0278993A1 in that provision is advantageously made to form, in the stack, a fragile separating interface region located between the piezoelectric or pyroelectric or ferroelectric film and the temporary substrate, or the initial carrier substrate.

It thus becomes possible to undo this interface via mechanical means (insertion of a blade for example) without consuming the initial substrate.

One major advantage of the present invention resides in the fact that it is possible to recover the initial substrate (the latter not being consumed, contrary to the chemical/physical/mechanical etching methods commonly used).

Generally, the advantages of the present invention reside in: the transfer of a piezoelectric or pyroelectric or ferroelectric layer (severed from the bulk single-crystal substrate) to a temporary substrate; in the ability to provide a fragile separating interface region that is able to withstand the thermal budget and the associated thermomechanical stresses; in the ability to provide a second bond, this one being the ultimate one, of the piezoelectric or pyroelectric or ferroelectric layer to an ultimate substrate; and lastly in the ability to detach the piezoelectric or pyroelectric or ferroelectric layer from the temporary substrate without detaching it from the ultimate substrate.

Generally, a fragile interface may be produced when two compounds placed in contact exhibit an interdiffusion that leads to the generation of structural defects and/or stresses. Among reactions known to generate fragility, mention may be made of the silicidation of metals (W, Ti, Co, Ni, Mo, Ta, Ru, etc.) that occurs at high temperature when these metals are brought into contact with silicon. Compounds ($WSi_2$, $TiSi_2$, $CoSi_2$, NiSi, $MoSi_2$, $TaSi_2$, $Ru_2Si_3$, etc.) are then produced that have a volume larger than that of the original metal, leading to the appearance of high stresses that may lead to delamination of the interface as described in the article by O. Thomas, *Les siliciures de métaux de transition en microélectronique: propriétés mécaniques et contraintes induites au cours de la formation en phase solide* [which may be translated as "The silicides of transition metals in microelectronics: mechanical properties and stresses induced during solid-phase formation"], PlastOx 2007, 277-286 (2009) or in the article by C. S. Petersson, J. E. E. Baglin, J. J. Dempsey, F. M. d'Heurle, S. J. La Placa, "Silicides of ruthenium and osmium: thin film reactions, diffusion, nucleation and stability", Journal of Applied Physics 53, 4866 (1982).

A fragile interface may also form when one of the layers making contact at the separating interface comprises at least $SiO_2$ and/or silicon nitride (such as SiN and/or $Si_3N_4$), and the other comprises at least one noble metal (platinum Pt, gold Au, silver Ag, rhodium Rh, osmium Os, palladium Pd, ruthenium Ru, iridium Ir) [G. Le Rhun, C. Dieppedale and S. Fanget, *Procédé transfert de couche(s) de matériau depuis un premier substrat sur un deuxième substrat* [which may be translated as "Process for transferring one or more layers of material from a first substrate to a second substrate"], patent No. FR 3082997]. The application of an anneal at a temperature above a certain threshold depending on the pair of materials chosen in step 3 of the process described above causes the noble metal to migrate into the layer of silicon oxide or nitride and the interface to become fragile, and this fragile interface will subsequently be able to be opened in step 7 such as described above through mechanical means.

After the thin piezoelectric layer has been transferred, in step 2 of the process described above, since the thermal budget remains moderate, the interdiffusion effects are still not activated. By spending, on the stack, in step 3 of the process described above, a high thermal budget, the anneal used to heal the piezoelectric layer (temperature typically comprised between 300 and 700° C., applied for a time from 1 to 10 h) also leads to the formation of a fragile interface by causing metal to diffuse into the silicon oxide or nitride. This interface retains enough bonding energy to permit steps 4-6 of the process described above, but its fragility allows detachment to be caused through mechanical means, such as insertion of a blade, in step 7 of the process described above.

On account of the specificities of the process for achieving layer transfer via crystal ion slicing (CIS) (combination of ion implantation, of bonding and of splitting that may be induced thermally, mechanically or chemically), it will be noted that: the first bond, in step 2 of the process described above, must have a sufficient bonding energy to ensure the mechanical integrity of the assembly consisting of the temporary substrate and donor substrate, despite the high thermomechanical stresses experienced in the steps of splitting the donor substrate and of chemical-mechanical polishing, and be capable of withstanding anneals at high temperatures (above 400° C., and potentially up to 600° C.). Typically, the bonding energy must be of the order of 1-1.5 $mJ/m^2$. This bond must also be able to be undone relatively simply via mechanical detachment (for example via insertion of a blade). Lastly, this material must be able to be deposited at low temperature (and ideally at room temperature) in order not to cause premature ripening of the implantation defects; the second bond, in step 6, for its part, must meet the following constraints: have a high bonding energy, in order to ensure not only the adhesion of the transferred layer throughout the rest of the fabricating process, and in particular in steps that involve a high thermal budget, but also the reliability of the component at the end of fabrication; and resist the step of undoing the temporary first bond. Mineral bonding layers (for example: $SiO_2$, $SiO_xN_y$) or metal bonding layers (for example: copper, gold, etc.) possessing an energy higher than that of the detaching interface (typically, higher than 2-3 $mJ/cm^2$) will therefore necessarily be preferred.

Ideally, the bonding material possesses a planarizing nature in order to facilitate the encapsulation of layers inserted before the second transfer (i.e. layers such as, for example, lower electrodes) and must be able to be planarized before bonding. The constraint on the temperature withstand of this layer is greatly relaxed, and no longer depends on anything but the rest of the process. This for example optionally allows polymers, which conventionally are unable to withstand high thermal budgets (>300° C.), to be integrated into the list of possible bonding-material candidates.

It will be noted that, even though the underlying issues of bulk-acoustic-wave resonators were described above, the present invention is entirely applicable to any type of component requiring the transfer of a single-crystal layer requiring a step of healing annealing at relatively high temperature and, moreover, integration of materials that are potentially unable to withstand these anneals. Possible applications comprise any other type of elastic-wave components (SAW filters or Lamb-wave filters), but also potentially applications using the piezoelectric and ferroelectric properties of the material, such as for example pyroelectric sensors.

In order to illustrate the diversity of components able to advantageously be fabricated using the process of the present invention, the Applicant has described below a few examples of application.

Figure 4A:
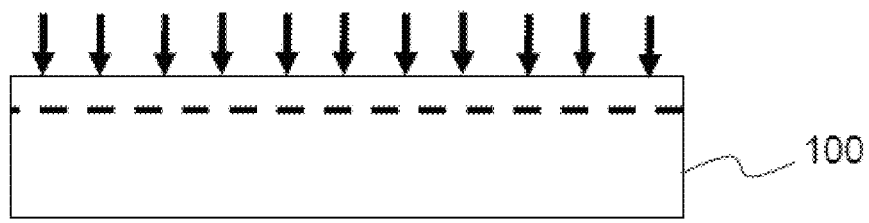
FIG. 4A illustrates a step of a first variant of a process according to the invention.

First Variant of the Invention Comprising Producing a Bulk-Acoustic-Wave (BAW) Resonator Made of Lithium Niobate:

Step 1.1:
Light ions (He, H) are implanted into a lithium-niobate donor substrate 100 as illustrated in FIG. 4A.

Figure 4B:
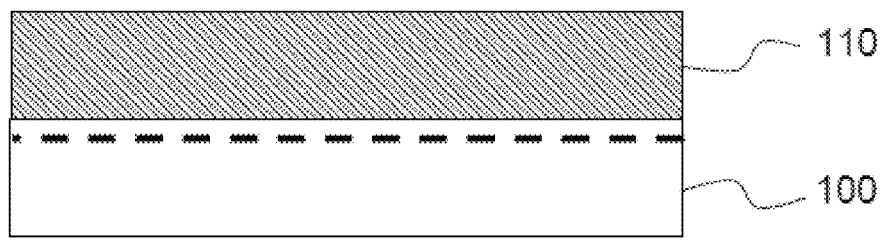
FIG. 4B illustrates a step of a first variant of a process according to the invention.

Step 1.2:
A bonding layer 110, which may for example be a layer of $SiO_2$ deposited by reactive sputtering of an Si target in an $Ar/O_2$ plasma, is deposited on the donor substrate 100 as illustrated in FIG. 4B. Next, an operation of chemical-mechanical polishing (CMP) and/or plasma activation is carried out.

Figure 4C:
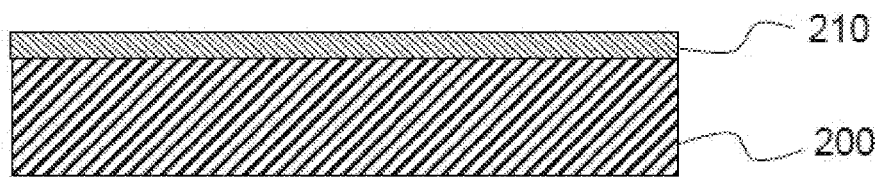
FIG. 4C illustrates a step of a first variant of a process according to the invention.

Step 1.3:
In parallel, an oxide layer 210 is deposited on a temporary receiver substrate 200. The oxide layer may be identical to that produced on the donor substrate or be a thermal oxide, as illustrated in FIG. 4C. Likewise, the temporary receiver substrate 200 may be of the same nature ($LiNbO_3$) or of a different nature (Si, glass, sapphire) to that of the donor substrate 100.

Figure 4D:
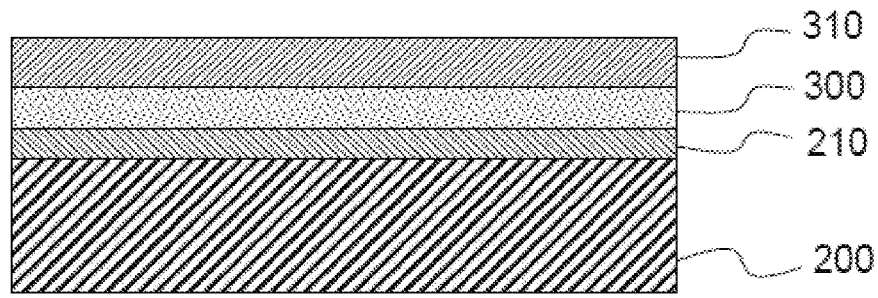
FIG. 4D illustrates a step of a first variant of a process according to the invention.

Step 1.4:
The fragile separating interface region is then produced on the surface of the whole bonding layer 210 on the temporary receiving substrate 200. To this end, a noble metal 300 (e.g.: Pt, Pd, Au) is deposited and an (oxide) bonding layer 310 is deposited, then an operation of chemical-mechanical polishing and/or plasma activation is carried out, as illustrated in FIG. 4D. The roughness of the noble-metal layer may typically be comprised between 0.5 and 5 nm. Optionally, an adhesion layer (e.g.: Cr, Ti, TiN, Ta, TaN, $Ta_2O_5$, $TiO_2$, WN, $WO_3$) may be inserted between the layer of noble metal and the layer of bonding oxide in order to promote the adhesion of the latter. This adhesion layer may also act as a barrier layer to the diffusion of elements into the substrate.

Figure 4E:
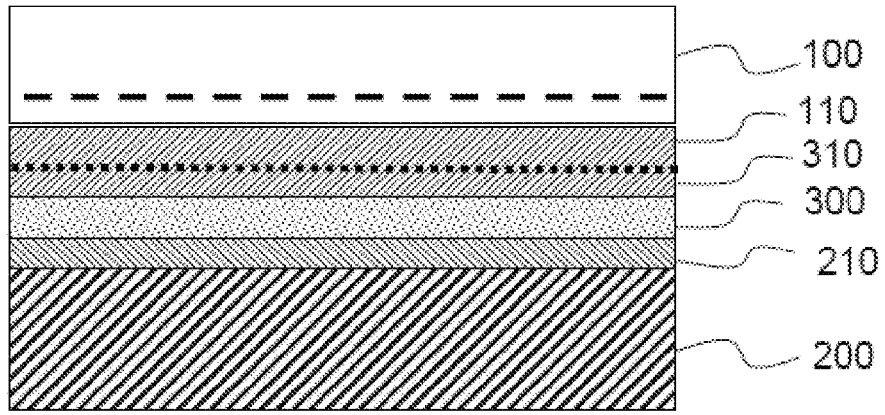
FIG. 4E illustrates a step of a first variant of a process according to the invention.
Figure 4F:
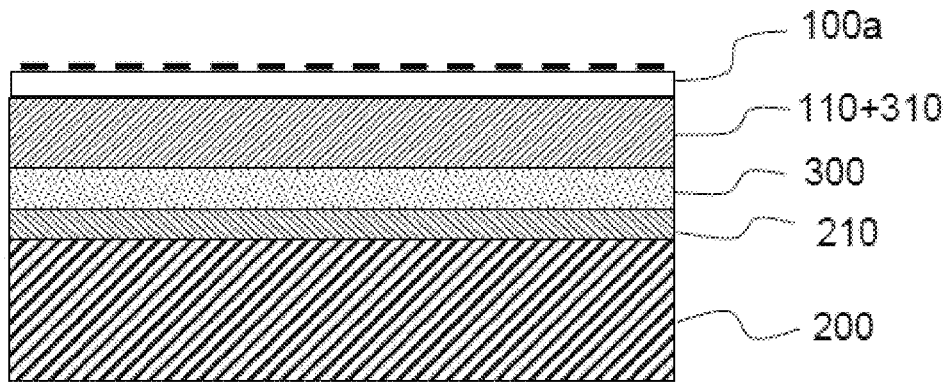
FIG. 4F illustrates a step of a first variant of a process according to the invention.

Step 1.5:

The donor substrate 100 (plus bonding layer 110) is bonded to the temporary substrate 200 (plus bonding layer 210, plus fragile interface region: 300 et 310) as illustrated in FIG. 4E. In this example, it is a question of direct $SiO_2/SiO_2$ bonding, which is for example achievable by polishing the two substrates, surface activation, placement in contact, and consolidating anneal, as illustrated in FIG. 4E. In order to avoid the effects of differential expansion between donor and temporary substrates, in this example a temporary substrate made of lithium niobate (of same crystal orientation as the donor) is employed. Step 1.6:

The transferred layer 100a is detached and thus left bare, in this example using the "Smart Cut" process (technology developed by the Applicant) and a splitting anneal, as illustrated in FIG. 4F.

Figure 4G:
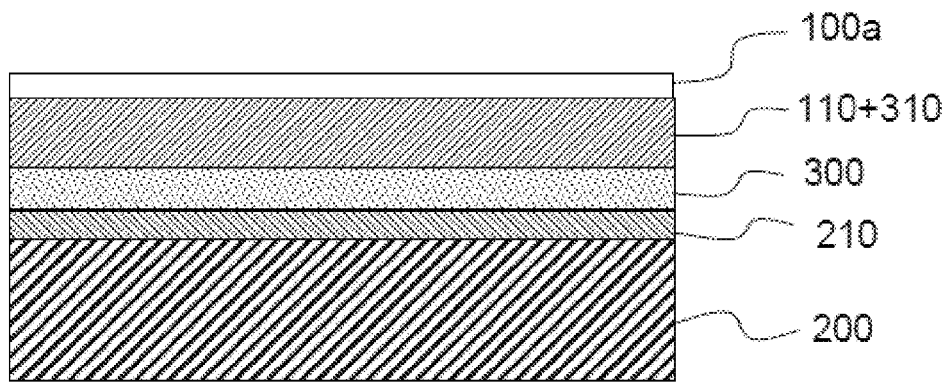
FIG. 4G illustrates a step of a first variant of a process according to the invention.

Step 1.7:

A healing anneal is carried out, then the transferred layer 100a is polished and its thickness adjusted, or, vice versa, the transfer layer is polished, its thickness adjusted and then the healing anneal carried out, as illustrated in FIG. 4G.

Figure 4H:
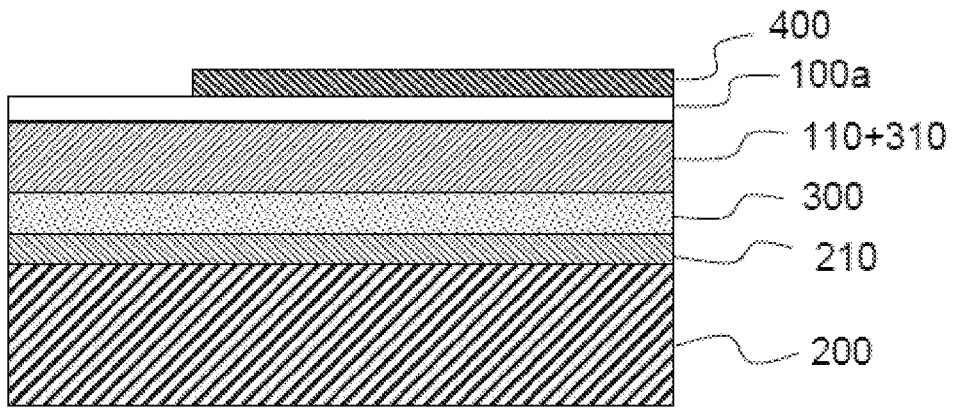
FIG. 4H illustrates a step of a first variant of a process according to the invention.

Step 1.8:

The lower electrode 400 (which is for example made of aluminium) is deposited (by sputtering) then operations of photolithography and etching (chemical etching for example) of the metal layer are carried out and the resist removed, as illustrated in FIG. 4H.

Figure 4I:
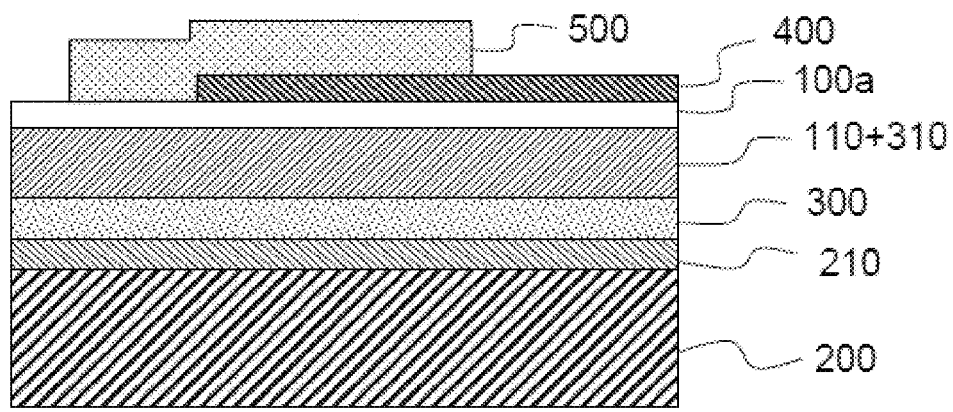
FIG. 4I illustrates a step of a first variant of a process according to the invention.

Step 1.9:

The following are then carried out: deposition of a sacrificial layer 500, which is for example made of amorphous silicon, photolithography, reactive-ion etching and resist removal, in order to define releasing wells, as illustrated in FIG. 4I.

Figure 4J:
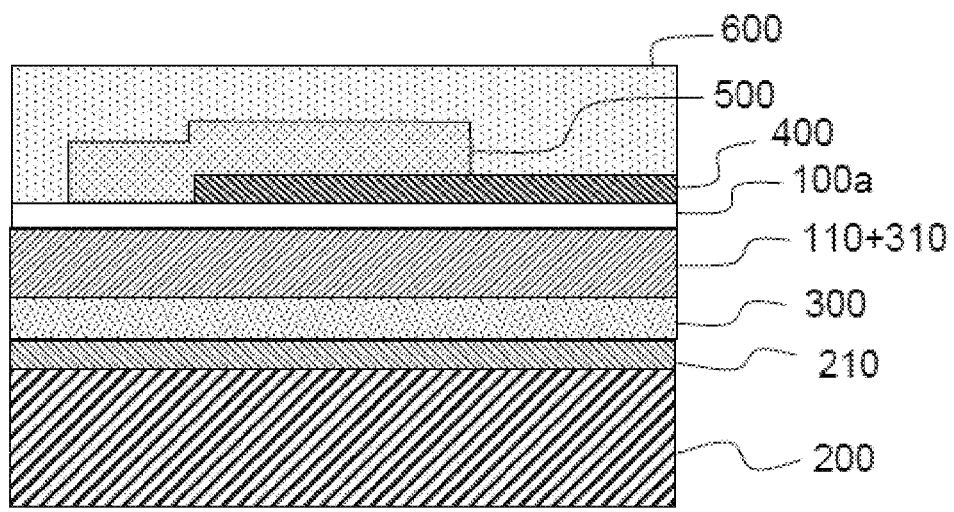
FIG. 4J illustrates a step of a first variant of a process according to the invention.

Step 1.10:

A bonding layer 600 (for example made of $SiO_2$) is deposited (by reactive sputtering of a silicon target in an $Ar/O_2$ plasma) and an operation of chemical-mechanical polishing (CMP) is carried out to remove the topology caused by the presence of the lower electrode and of the releasing well, as illustrated in FIG. 4J.

Figure 4K:
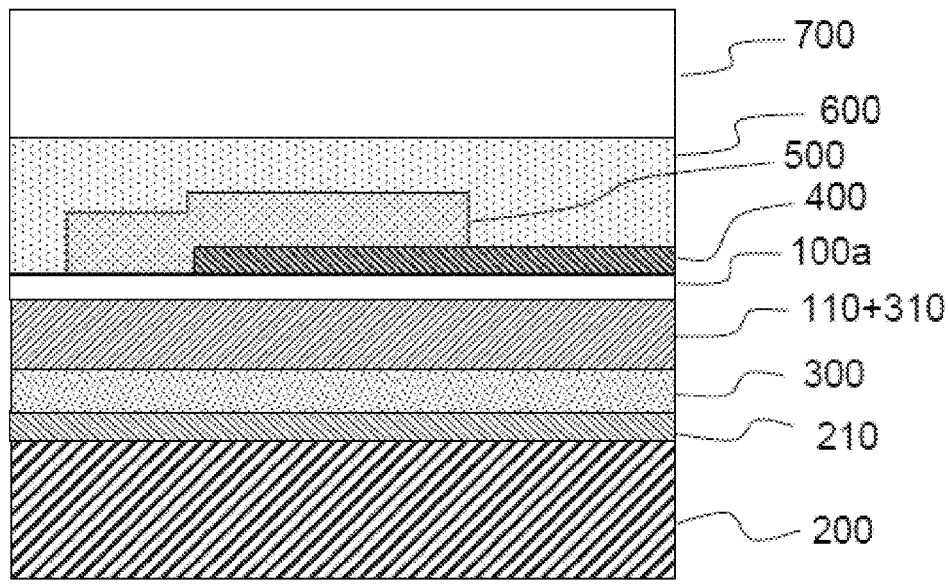
FIG. 4K illustrates a step of a first variant of a process according to the invention.

Step 1.11:

A second joining operation, in which the temporary substrate 200 is bonded to the ultimate substrate 700, is carried out as illustrated in FIG. 4K. The process used is the same as that used to form the first bond. To avoid the effects of differential expansion, an ultimate substrate made of lithium niobate, and of the same crystal orientation as that of the temporary substrate, is advantageously used.

Figure 4L:
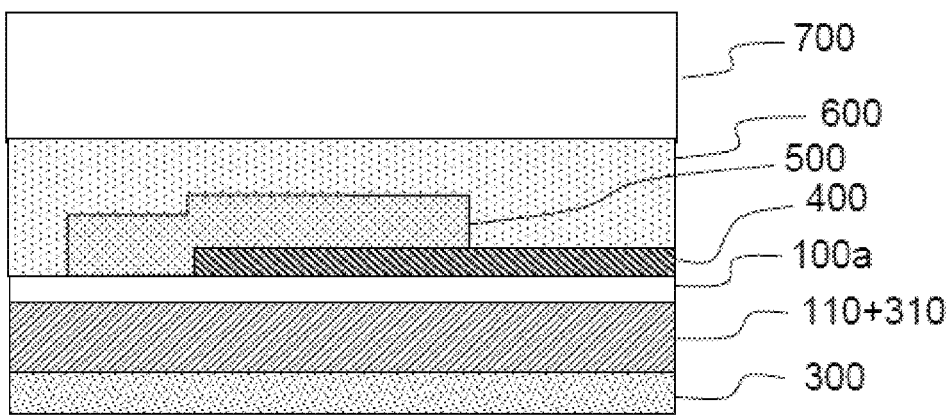
FIG. 4L illustrates a step of a first variant of a process according to the invention.
Figure 4L:
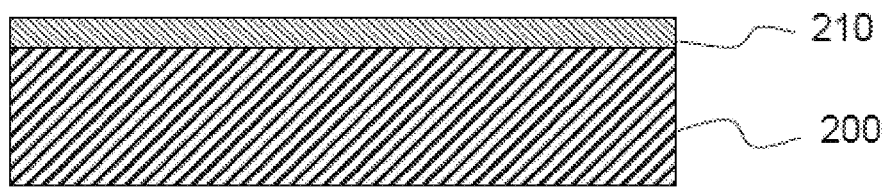

Step 1.12:

The operation of separating the two substrates via the fragile separating interface region comprising the layer 300 is then carried out, as illustrated in FIG. 4L, so as to achieve debonding (detachment), this possibly advantageously being done by inserting a blade at the fragile interface.

Figure 4M:
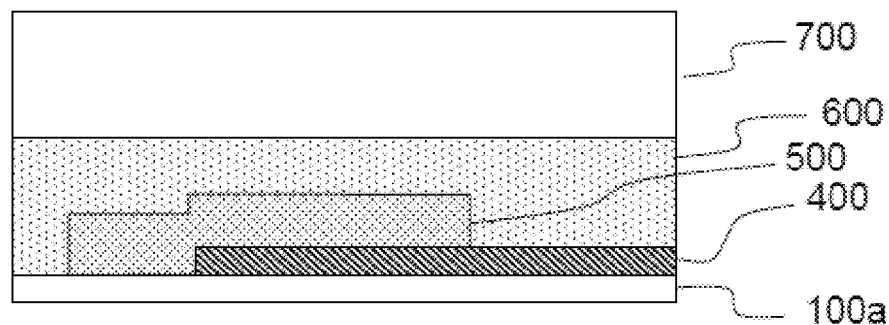
FIG. 4M illustrates a step of a first variant of a process according to the invention.

Step 1.13:

The metal layer 300 comprised in the fragile separating interface region is then removed, leaving the layer of interest 100a bare as illustrated in FIG. 4M. It may typically be a question of removing Pt metal via dry etching and removing the oxide in HF.

The rest of the process may typically be made up of steps identical to those presented in the prior art.

Figure 4N:
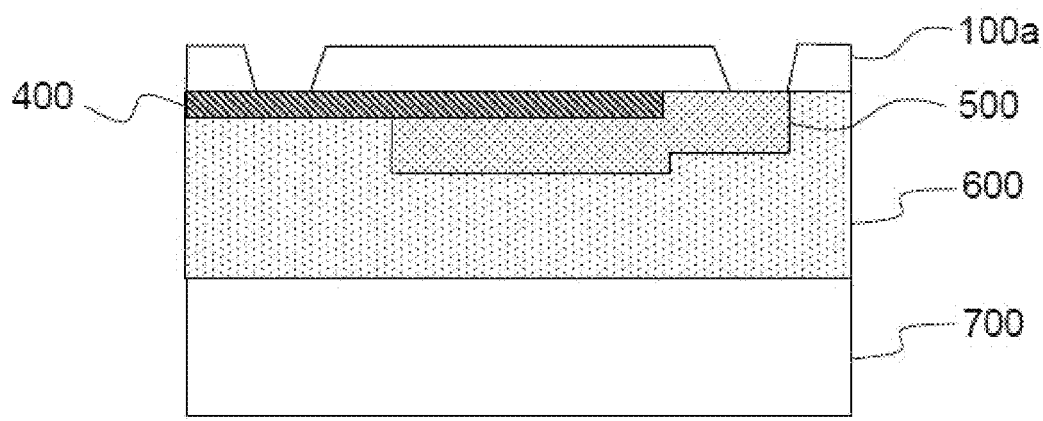
FIG. 4N illustrates a step of a first variant of a process according to the invention.

Step 1.14:

Apertures are etched in the layer of interest 100a, namely the transferred lithium-niobate film, for example by photolithography, ion-beam etching (IBE) and resist removal, as illustrated in FIG. 4N.

Figure 4O:
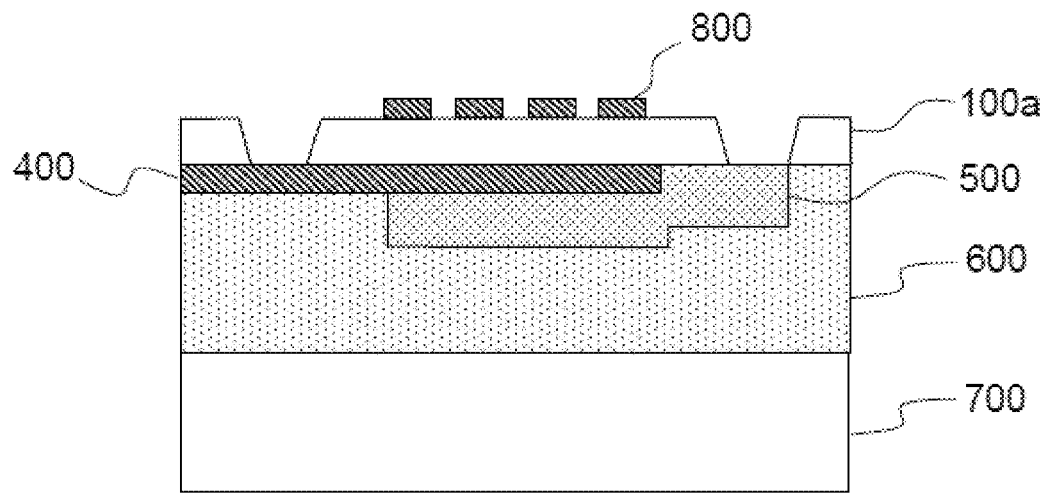
FIG. 4O illustrates a step of a first variant of a process according to the invention.

Step 1.15:

Upper electrodes 800, for example made of aluminium, are then formed on the surface of the previously structured layer of interest 100a, via deposition by sputtering, photolithography, wet etching and resist removal, as illustrated in FIG. 4O.

Figure 4P:
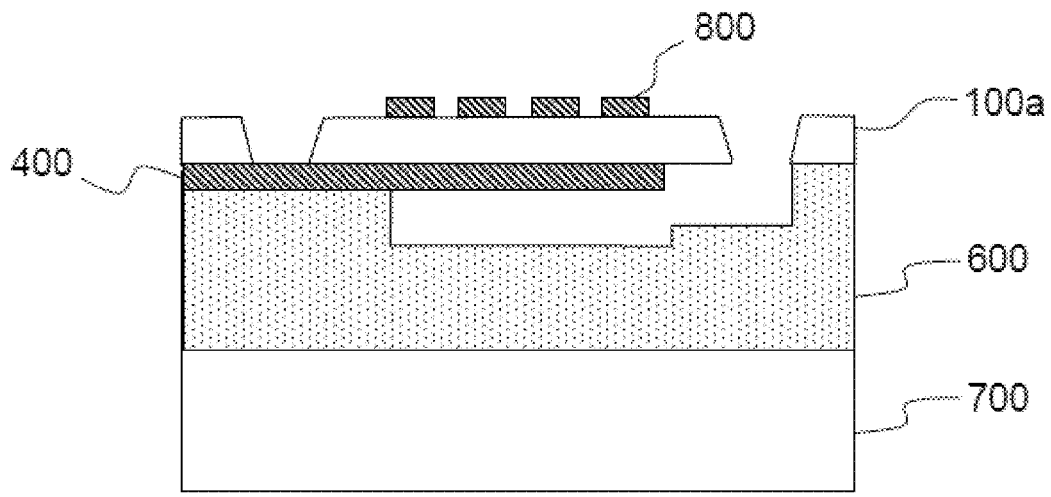
FIG. 4P illustrates a step of a first variant of a process according to the invention.

Step 1.16:

The membranes containing the resonators are then released, by etching the wells of sacrificial layer 500 (here using gaseous $XeF_2$ to dissolve the wells, which are made of amorphous silicon), as illustrated in FIG. 4P.

It will be noted that this first variant embodiment proposes to use a detaching layer located directly in contact with the transferred layer, without this presupposing an exact location of this layer with respect to the bonding interface. It is for example possible to locate this sacrificed layer in contact with the temporary substrate, or even to insert it between two layers identical to the bonding layer. In both the latter cases, after the first bond has been undone, provision may be made for a step of removing the residual layer making contact with the transferred layer if this residual layer is not desired in the final stack.

Figure 5A:
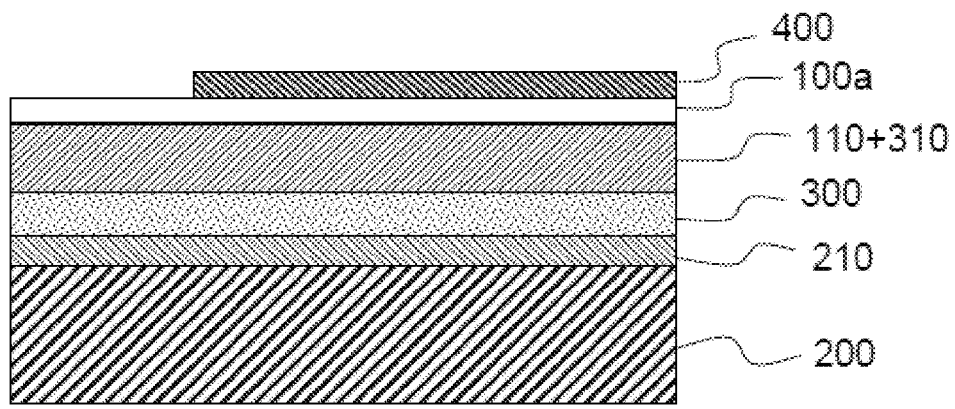
FIG. 5A illustrates a step of a second variant of a process according to the invention.

Second Variant of the Invention in which the Thin Piezoelectric Film is Transferred to a Substrate with Predefined Cavities According to this variant, there is no (aSi) sacrificial layer as presented in the first variant of the process in step 1.9. Acoustic isolation is achieved via the formation of predefined cavities in the final substrate. The following is one example of a process using this variant:

First series of steps, this series being referenced step 2.1: the same operations as those described in step 1.1 to step 1.8 of the first process variant may be repeated, this leading to the structure illustrated in FIG. 5A, which shows the stack of layers: 200/210/300/310/110/100a, with an electrode 400, the layer 100a corresponding to the layer of piezoelectric material.

Figure 5B:
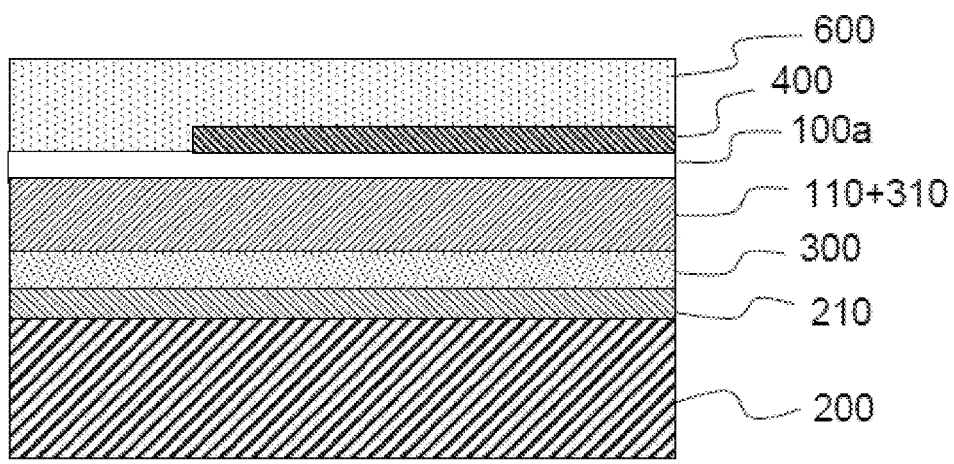
FIG. 5B illustrates a step of a second variant of a process according to the invention.

Step 2.2:

A bonding layer 600 (for example made of $SiO_2$) is deposited (by reactive sputtering of a silicon target in an $Ar/O_2$ plasma), then an operation of chemical-mechanical polishing (CMP) is carried out to remove the topology caused by the presence of the electrode, as illustrated in FIG. 5B.

Figure 5C:
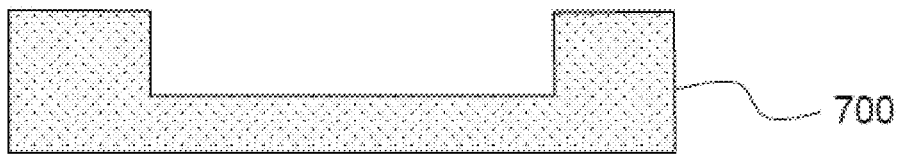
FIG. 5C illustrates a step of a second variant of a process according to the invention.

Step 2.3:

Predefined cavities are produced in the final substrate 700 (Si, glass, sapphire, LNO, LTO) by photolithography, physical and/or chemical etching, then resist removal (or stripping), as illustrated in FIG. 5C.

Figure 5D:
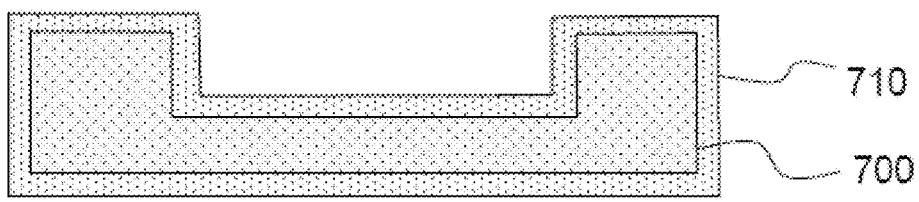
FIG. 5D illustrates a step of a second variant of a process according to the invention.

Step 2.4:

A layer of bonding oxide 710 is deposited (preferably chemically for the sake of conformality) or grown via thermal oxidation (presented case). The oxide may have an RMS roughness comprised between 0.1 and 0.5 Å and is compatible with direct bonding, as illustrated in FIG. 5D.

Figure 5E:
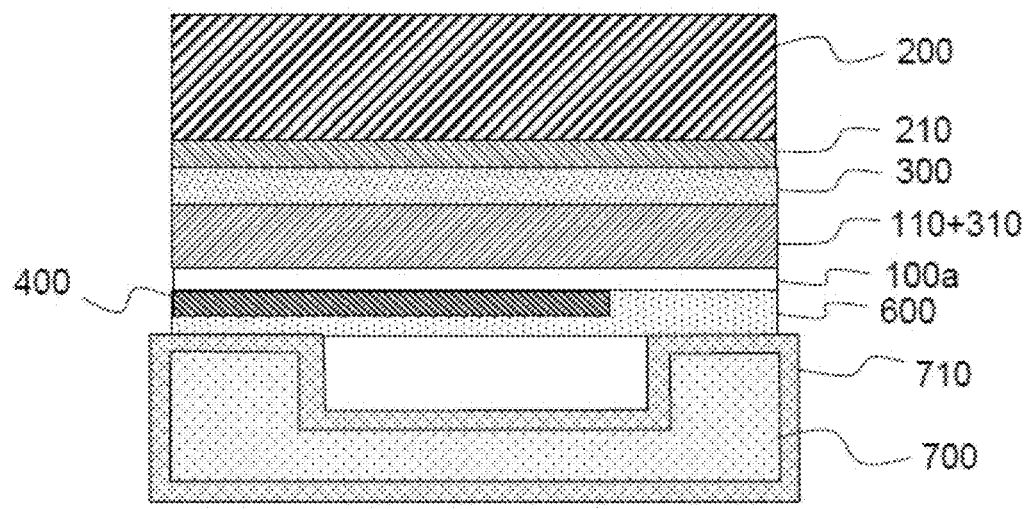
FIG. 5E illustrates a step of a second variant of a process according to the invention.

Step 2.5:

Next, the temporary substrate 200 and final substrate 700 are joined via all the intermediate layers produced beforehand, then a consolidating anneal is carried out, as illustrated in FIG. 5E.

Figure 5F:
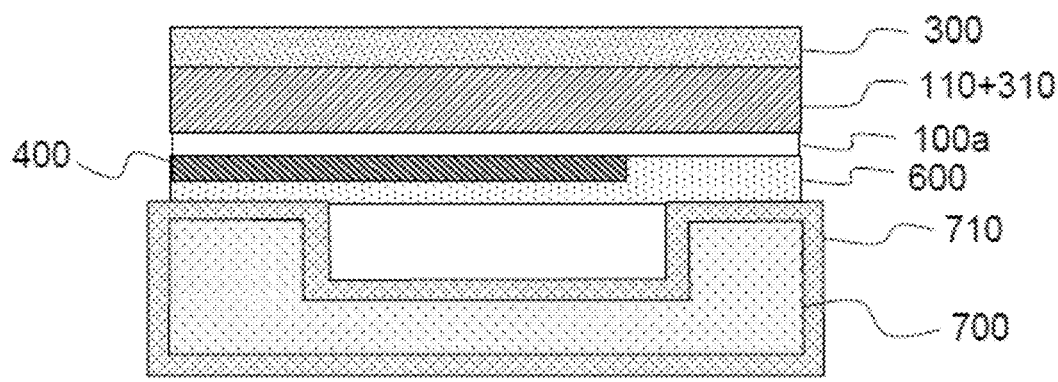
FIG. 5F illustrates a step of a second variant of a process according to the invention.

Step 2.6:

The temporary substrate 200 is detached (advantageously by inserting a blade) via the fragile separating interface region as illustrated in FIG. 5F, then the materials from which the fragile interface is made are etched.

Figure 5G:
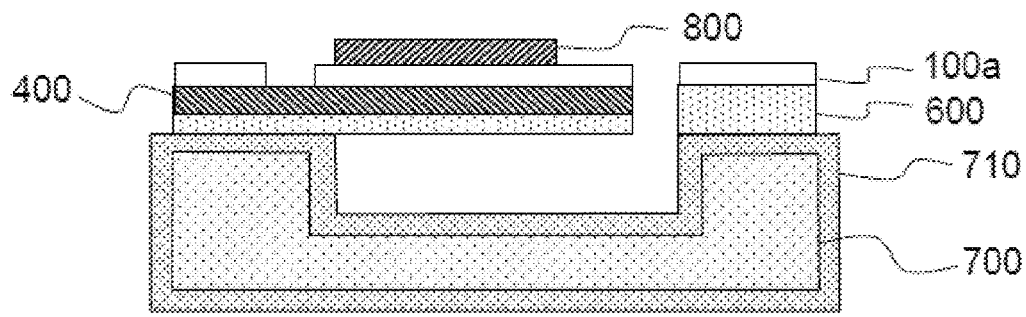
FIG. 5G illustrates a step of a second variant of a process according to the invention.

Last Series of Steps, which Series is Referenced: Step 2.7:

The production process is ended by carrying out the same operations as those described in the steps of the first variant, leading to the structure illustrated in FIG. 5G, which shows the structured layer of interest 100a comprised between the electrodes 400 and 800.

Third Variant of the Invention Comprising Transferring a Thin Single-Crystal Film to Silicon:

One of the issues mentioned in the prior art is the fact of being incapable of transferring a thin single-crystal piezoelectric layer to silicon. This is partially related to the need to apply high-temperature heat treatments, this, combined with the large differences in coefficient of thermal expansion between these materials and silicon, often leading to breakage of samples. The Applicant thus proposes to use the invention to more easily transfer the piezoelectric layer to silicon.

The production process is then in every way identical to the preceding processes. A first transfer, of the thin piezoelectric layer to a temporary substrate that is identical to the donor substrate (reference then being made to homostructure transfer), is carried out. This allows the effects of thermoelastic stresses in the steps of bonding, splitting and annealing at high temperature, to be limited. In the second transfer, the relatively low bonding anneal temperatures required in steps 1.11 (or 2.5) (typically of the order of 150 to 200° C. depending on the materials present) is taken advantage of to limit the thermomechanical stresses resulting from the differential in thermal expansion between the temporary and final substrate. The risk of breakage of the bonded-together wafers is therefore almost reduced to zero, this allowing the use of a silicon substrate as ultimate substrate to be envisaged.

It will be noted that, if the transferred layer is thin enough with respect to the temporary substrate (thinner than one micron, for a substrate of the order of 500 µm), it will not be able to generate thermoelastic stresses in the annealing steps: in contrast, it will undergo the expansion of the substrate elastically. In this case, if the bonding is strong enough for the risk of delamination to be low, it is possible to envisage a direct transfer to an ultimate substrate different from the donor substrate.

Fourth Variant of the Invention Comprising Producing a Plate-Wave Component.

The preceding embodiments may be used for types of resonators other than BAW resonators. They may for example be used to produce plate-acoustic-wave resonators (also called Lamb-wave resonators, or contour-mode resonators, etc.). One of the variants of these components is said to employ vertical field excitation (VFE): the plate waves are excited in a piezoelectric membrane by applying an electric field that is oriented through the thickness of the plate, this being achieved by placing a floating electrode on one of the faces of the membrane (the lower face for example) and electrodes taking the form of interdigitated combs on the opposite face. The process for producing these components is therefore highly analogous to that of a bulk-wave resonator: the only difference is the geometries of the patterns of the electrodes and of the sacrificial layers.

Another variant of these plate-wave components is said to employ lateral field excitation (LFE): the plate waves are excited in a piezoelectric membrane this time by applying a horizontal electric field, this being achieved by placing electrodes, which again take the form of interdigitated combs, on only one of the faces of the plate. The production process is thus exactly the same, except that the steps required to produce the lower or upper electrodes are not required.

Fifth Variant of the Invention Comprising Producing a Solidly Mounted or Guided-Wave Bulk-Acoustic-Wave Resonator:

Variants of bulk-acoustic-wave or plate-acoustic-wave resonators use a Bragg mirror instead of an air-filled cavity to confine the elastic waves in the piezoelectric layer. Reference is then made to solidly mounted resonators (SMR) or guided-wave resonators, respectively. These mirrors are produced by stacking layers having, in alternation, low and high acoustic impedances (for example, $SiO_2$/W, or $SiO_2$/Mo, or $SiO_2$/AlN or SiOC/SiN, etc.) and thicknesses substantially equal to one quarter of a wavelength, although variants do exist that break this rule with a view to optimizing the acoustic characteristics of these mirrors.

The integration of such mirrors into resonators made of lithium niobate, for example, is tricky because the layers of these structures are generally deposited at high temperature in order to achieve relatively dense, or not very porous, materials that as a result will have reasonable acoustic attenuations. These deposition temperatures (typically of the order of 400 to 500° C.), coupled with the time taken to carry out the depositions required to produce complete stacks, and issues with stresses in these layers, make production, using prior-art processes, of these mirrors on the donor substrate complex. In contrast, use of the invention presented here allows production of mirrors on the healed transferred layer, which may withstand temperatures between 400 and 500° C. (close to the healing anneal temperatures), to be envisaged.

Figure 6A:
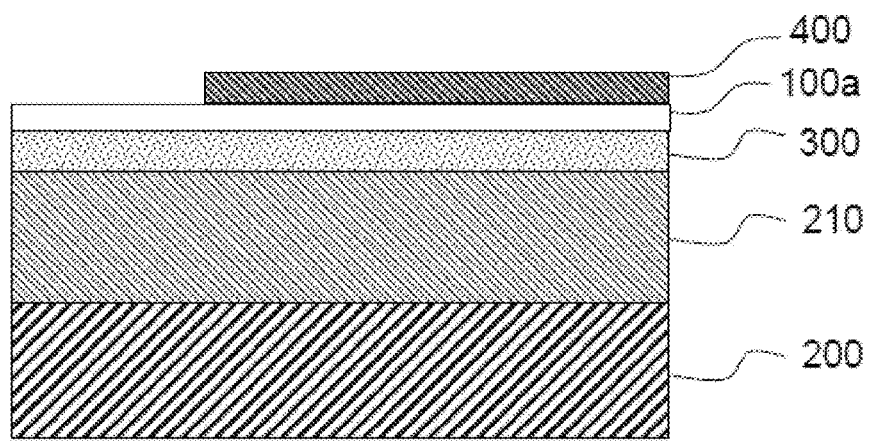
FIG. 6A illustrates a step of a third variant of a process according to the invention.

One example of a production process including such mirrors, and inspired by the first variant of the production process, is described below:

A First Series of Steps, which Series is Referenced Step 5.1:

Operations similar to those of steps 1.1 to 1.7 of the first variant are carried out and lead to the structure illustrated in FIG. 6A, which shows the layer of interest 100a, on the surface of the fragile separating interface region comprising the layer 300 and produced on the surface of the temporary substrate 200 covered with a layer 210, the layer of interest 100a being covered with an electrode 400.

Figure 6B:
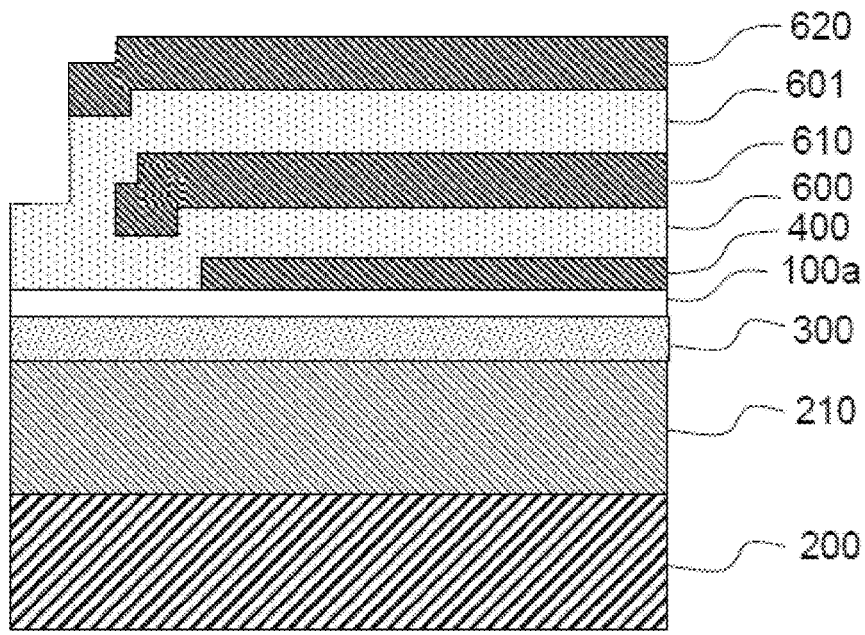
FIG. 6B illustrates a step of a third variant of a process according to the invention.

Step 5.2:

A stack is deposited of layers: made of $SiO_2$, which layer is referenced 600/made of W, which layer is referenced 610/made of $SiO_2$, which layer is referenced 601/made of W, referenced 620, for example by plasma-enhanced chemical vapour deposition (PECVD) as regards the $SiO_2$ and by chemical vapour deposition (CVD) as regards the W. Operations of photolithography, and reactive-ion etching are carried out on the W/$SiO_2$/W trilayer, then the resist is removed. This allows mirrors to be defined under the resonators, as illustrated in FIG. 6B.

Figure 6C:
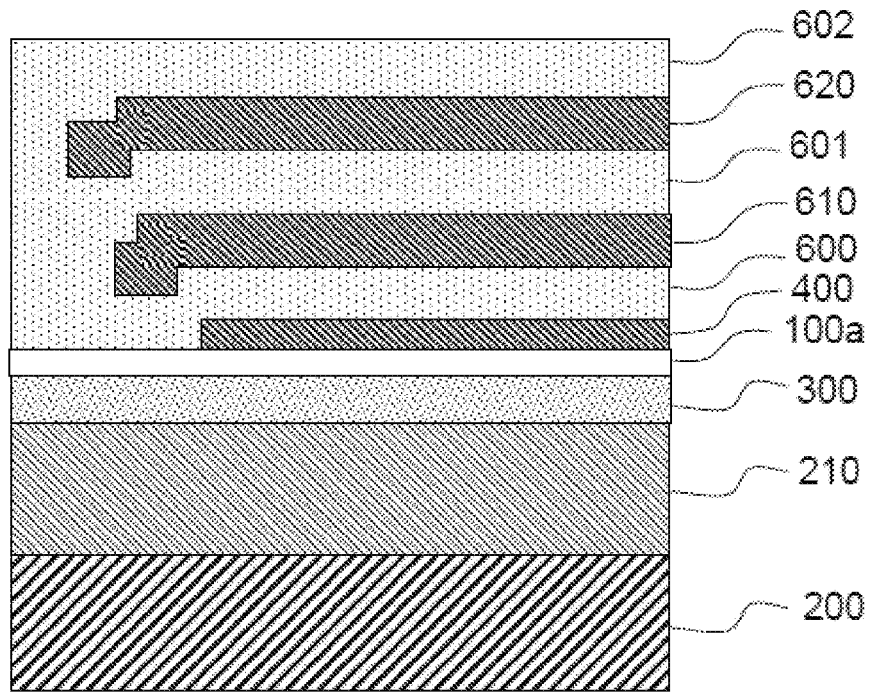
FIG. 6C illustrates a step of a third variant of a process according to the invention.

Step 5.3:

A layer 602 of $SiO_2$ is deposited, again by PECVD. An operation of planarization by chemical-mechanical polishing, optionally assisted by pre-etching of the $SiO_2$ layer located on the W/$SiO_2$/W stacks formed in the preceding step, is carried out, as illustrated in FIG. 6C.

Figure 6D:
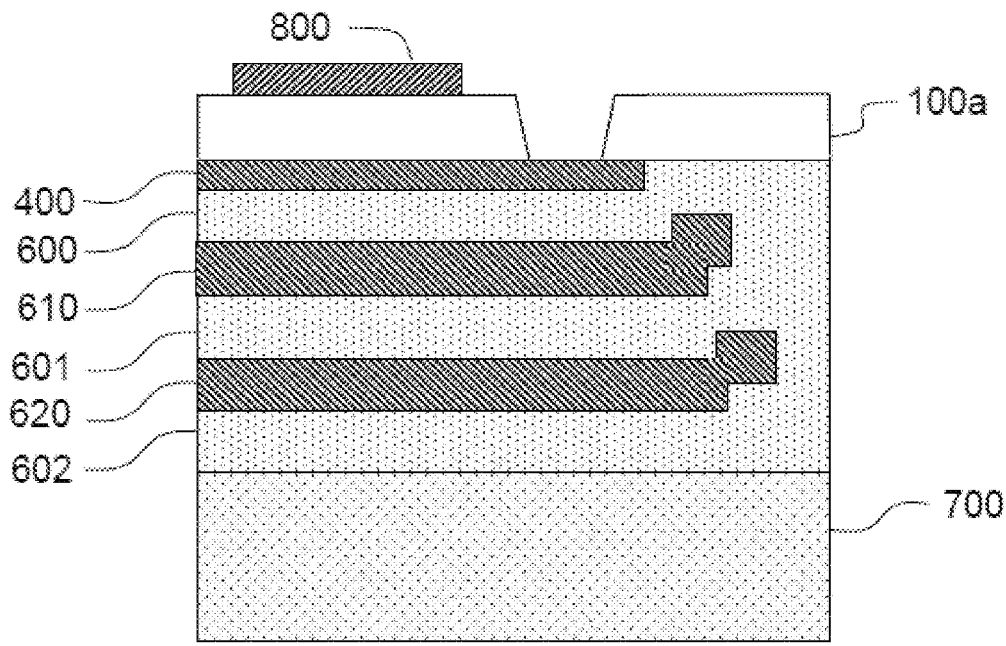
FIG. 6D illustrates a step of a third variant of a process according to the invention.

Step 5.4:

It is then possible to continue the production process according to the first fabricating-process variant in order to transfer the piezoelectric layer with its Bragg mirror to a final substrate 700, as illustrated in FIG. 6D.

Sixth Variant of the Invention Comprising a Pyroelectric Sensor

The invention is not solely applicable to the case of piezoelectric resonators and may be generalized to other types of components. Moreover, it is not limited to the use of a piezoelectric material such as lithium niobate. By way of example, the Applicant proposes to apply the invention to the case of pyroelectric sensors based on lithium tantalate. The principal consists in this case in producing lithium-tantalate membranes that are suspended in order to thermally isolate them from the substrate, and that are metallized on both faces thereof in order to form metal/insulator/metal capacitors. The principle of these sensors consists in measuring the capacitance variation observed when thermal radiation heats the suspended capacitor.

The use of releasing wells to form suspended membranes was described in the preceding examples. It is entirely possible in the present case, if it is possible to transfer the lithium-tantalate layer to silicon by virtue of the invention, to etch the back side of the silicon.

Figure 7A:
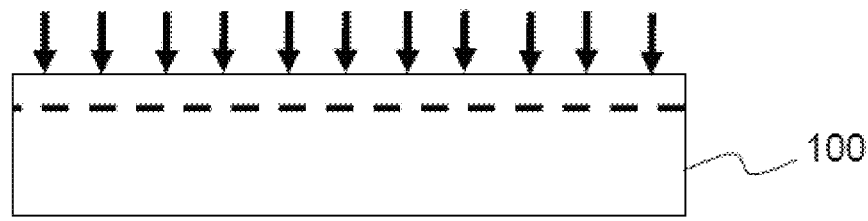
FIG. 7A illustrates a step of a sixth variant of a process according to the invention.

Step 6.1:
Light ions are implanted into a lithium-niobate substrate 100, as illustrated in FIG. 7A.

Figure 7B:
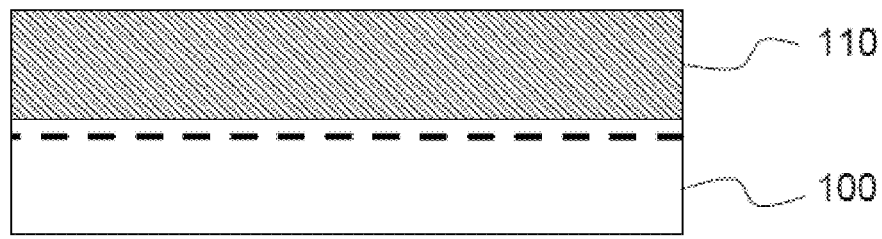
FIG. 7B illustrates a step of a sixth variant of a process according to the invention.

Step 6.2:
A bonding layer 110 is deposited on the donor substrate. In this example, it is proposed to use layers of $SiO_2$, deposited by reactive sputtering of an Si target in an $Ar/O_2$ plasma. An operation of chemical-mechanical polishing (CMP) and/or plasma activation is carried out, as illustrated in FIG. 7B.

Figure 7C:
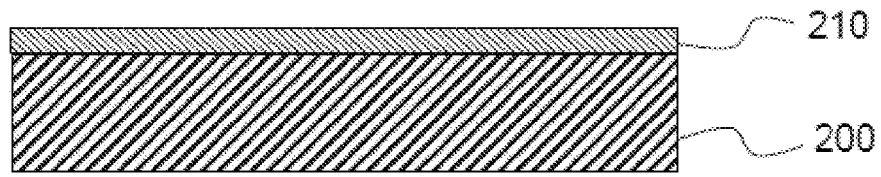
FIG. 7C illustrates a step of a sixth variant of a process according to the invention.

Step 6.3:
An oxide layer 210 is deposited on the temporary receiver substrate 200, as illustrated in FIG. 7C. The oxide layer may be identical to that of the donor substrate or be a thermal oxide. Likewise, the temporary receiver substrate 200 may be of same nature ($LiTaO_3$) or of different nature (Si, glass, sapphire) to the donor substrate.

Figure 7D:
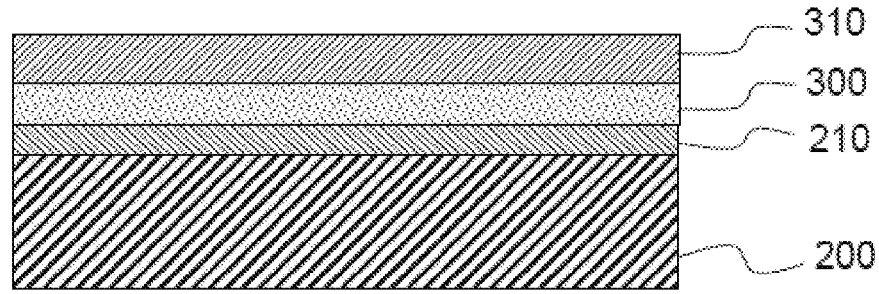
FIG. 7D illustrates a step of a sixth variant of a process according to the invention.

Step 6.4:
The fragile separating interface region is produced by depositing a noble metal (e.g.: Pt, Pd, Au) 300 and depositing an (oxide) bonding layer 310. Next, an operation of chemical-mechanical polishing and/or plasma activation is carried out, as illustrated in FIG. 7D. Optionally, an adhesion layer (e.g.: Cr, Ti, TiN, Ta, TaN, $Ta_2O_5$, $TiO_2$, WN, $WO_3$) may be inserted between the layer of noble metal and the layer of bonding oxide in order to promote the adhesion of the latter.

Figure 7E:
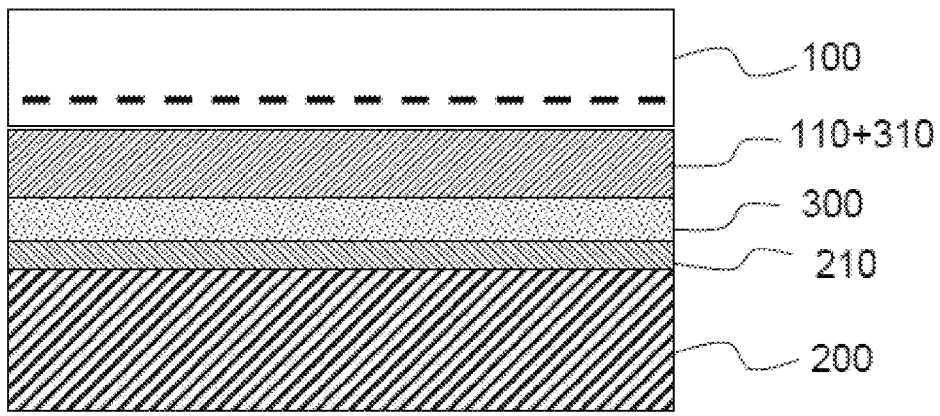
FIG. 7E illustrates a step of a sixth variant of a process according to the invention.

Step 6.5:
The donor substrate 100 is bonded to the temporary receiver substrate 200, as illustrated in FIG. 7E. In this example, it is a question of direct $SiO_2/SiO_2$ bonding, which is for example achievable by polishing the two substrates, surface activation, placement in contact, and consolidating anneal. In order to avoid the effects of differential expansion between donor and temporary substrates, in this example a temporary substrate made of lithium niobate (of same crystal orientation as that of the donor substrate) is employed.

Figure 7F:
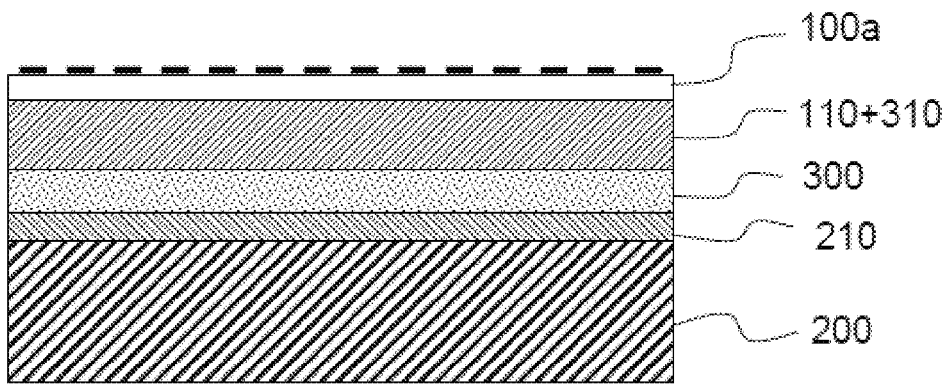
FIG. 7F illustrates a step of a sixth variant of a process according to the invention.

Step 6.6:
The transferred layer is detached, in this example using the "Smart Cut" process: splitting anneal, as illustrated in FIG. 7F, allowing the thin layer of interest to be defined in the material 100.

Figure 7G:
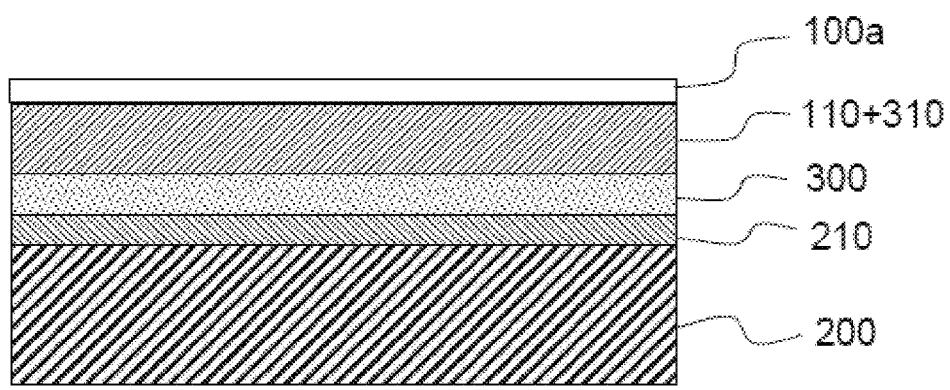
FIG. 7G illustrates a step of a sixth variant of a process according to the invention.

Step 6.7:
A healing anneal is carried out, then the transferred layer 100 is polished and its thickness adjusted, or, vice versa, the transfer layer is polished, its thickness adjusted and then the healing anneal carried out, as illustrated in FIG. 7G.

Figure 7H:
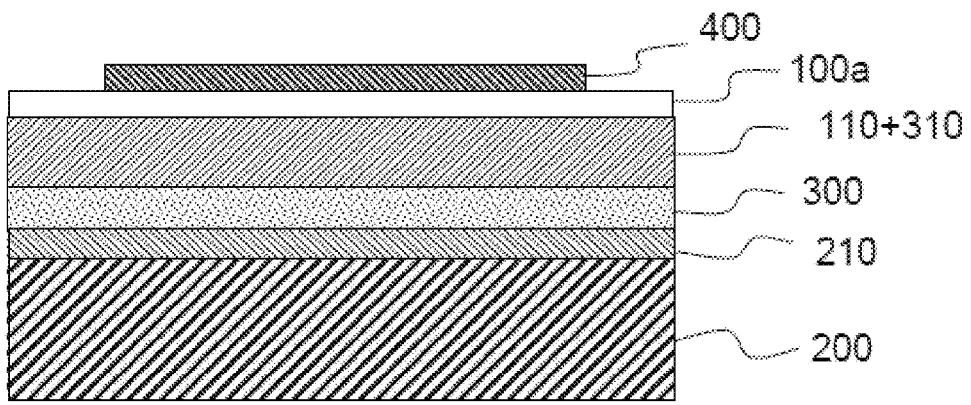
FIG. 7H illustrates a step of a sixth variant of a process according to the invention.

Step 6.8:
The lower electrode 400 (which is for example made of aluminium) is deposited (by sputtering) and photolithography and etching (chemical etching for example) of the metal layer are carried out and the resist removed, as illustrated in FIG. 7H.

Figure 7I:
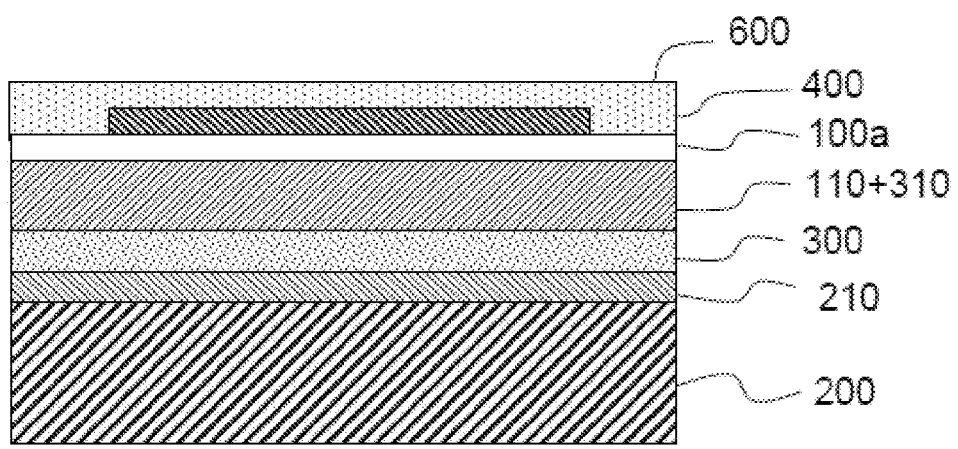
FIG. 7I illustrates a step of a sixth variant of a process according to the invention.

Step 6.9:
A bonding layer 600 (for example made of $SiO_2$) is deposited (for example by reactive sputtering of a silicon target in an $Ar/O_2$ plasma). An operation of chemical-mechanical polishing (CMP) is carried out to remove the topology caused by the presence of the electrode, as illustrated in FIG. 7I.

Figure 7J:
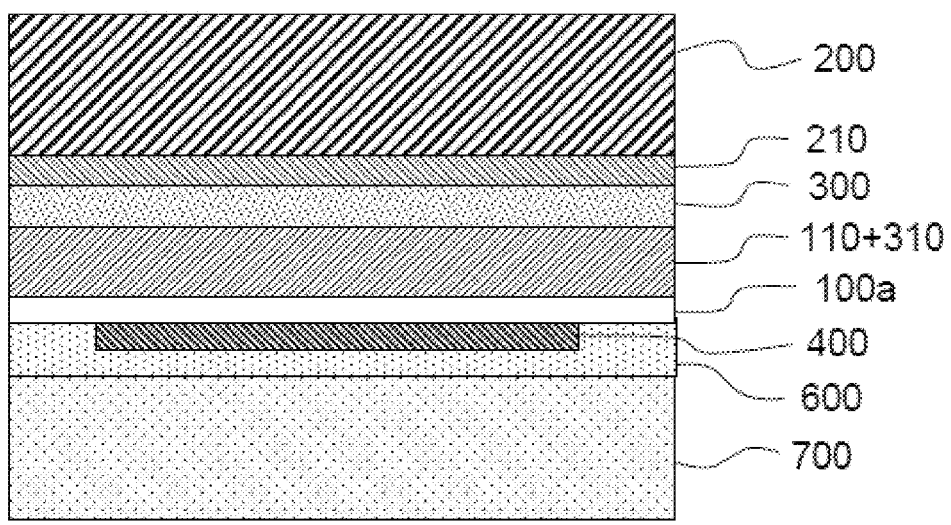
FIG. 7J illustrates a step of a sixth variant of a process according to the invention.

Step 6.10:
A second bonding operation, in which the temporary substrate 200 is bonded to the ultimate substrate 700, is carried out, as illustrated in FIG. 7J. In this example, the process used is the same as that used to form the first bond: it is a question of direct $SiO_2/SiO_2$ bonding, which is for example achievable by polishing the two substrates, surface activation, placement in contact, and consolidating anneal. As in step 6.3, in order to avoid the effects of differential expansion between donor and temporary substrates, in this example a temporary substrate made of lithium niobate (of same crystal orientation as that of the temporary substrate) is employed.

Figure 7K:
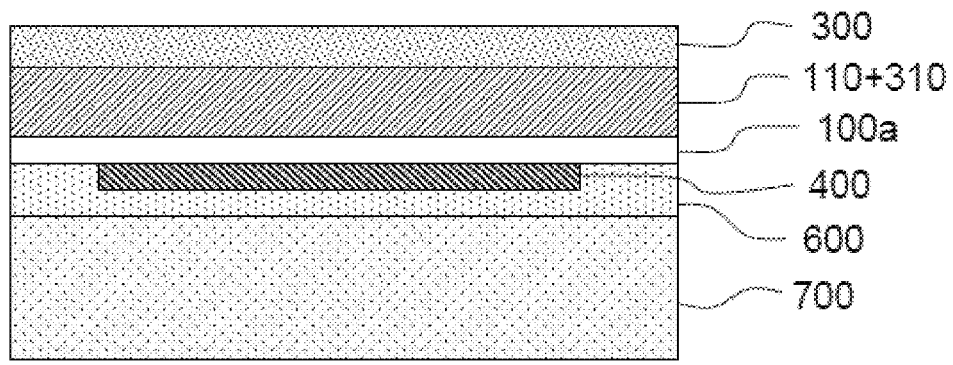
FIG. 7K illustrates a step of a sixth variant of a process according to the invention.
Figure 7L:
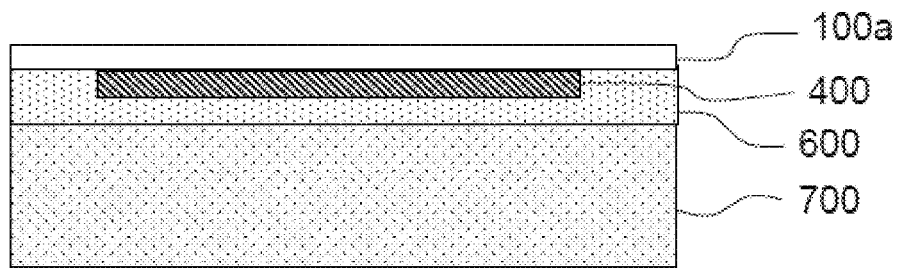
FIG. 7L illustrates a step of a sixth variant of a process according to the invention.

Step 6.11:
A splitting operation is carried out via the fragile interface, as illustrated in FIG. 7K, then the layers of the fragile interface 300 and 310+110 are removed by dry etching and/or wet etching, as illustrated in FIG. 7L.

Figure 7M:
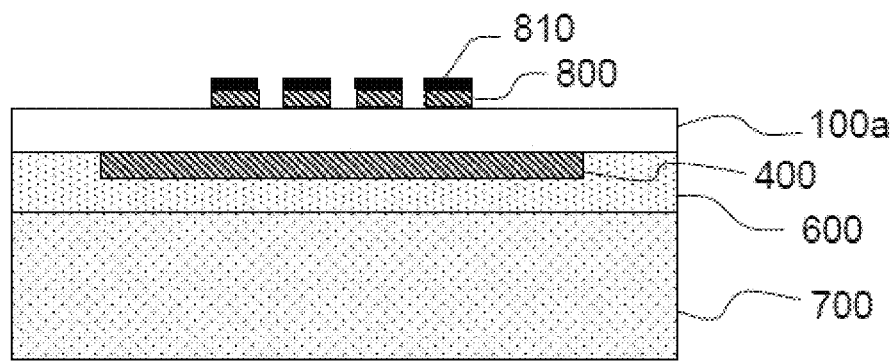
FIG. 7M illustrates a step of a sixth variant of a process according to the invention.

Step 6.12:
An upper electrode 800 and a layer 810 for absorbing infrared radiation are deposited and upper electrodes and this layer are defined to form capacitors, as illustrated in FIG. 7M.

Figure 7N:
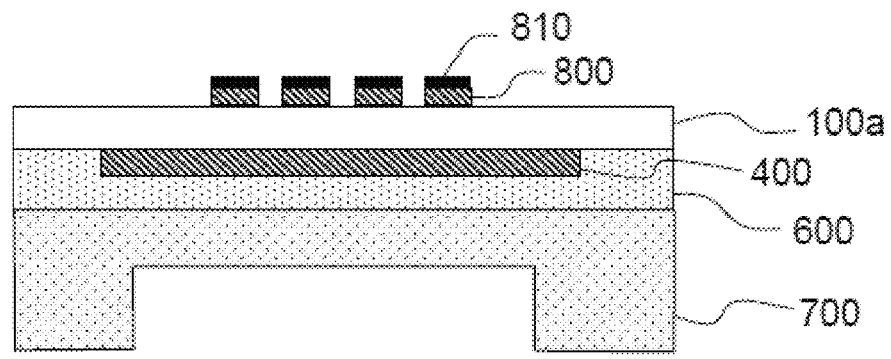
FIG. 7N illustrates a step of a sixth variant of a process according to the invention.

Step 6.13:
The back side of the substrate is etched by deep silicon etching (e.g.: DRIE) as illustrated in FIG. 7N.

Seventh Variant of the Invention Comprising Producing a Composite Resonator or Longitudinally Coupled Filter.

Certain variants of bulk-wave resonators, which variants are called "composite resonators", have been proposed in the literature, for example with a view to providing frequency-agile resonators. In this case, the resonator is composed of two piezoelectric layers and of respective sets of electrodes, one portion of the stack being connected to the filter circuit and the other to a frequency-tuning circuit.

A similar structure may consist of a set of stacked bulk-wave resonators that are mechanically coupled, via one or more layers, so as to generate a filter function. In this case, each piezoelectric layer forms one resonator, and one of the resonators acts as input and the other as output of the filter. Reference is then made to coupled resonator filters (CRF) or stacked crystal filters (SCF). With respect to composite resonators, ultimately only the thicknesses of the layers and the geometries of the electrodes differ, but the same production process may be envisaged.

A process for producing composite filters according to the prior art and involving transferring layers is for example described in patent application FR3076126. It consists in carrying out in succession two layer-transferring steps, each including one healing anneal. Thus, during the healing anneal of the second transferred layer, the stack made up of the first layer and of the associated electrodes again undergoes a relatively long anneal at high temperature. This may have particularly dramatic effects on the electrode located deepest. It is therefore advantageous to use the invention proposed here for each of the layer transfers.

Figure 8A:
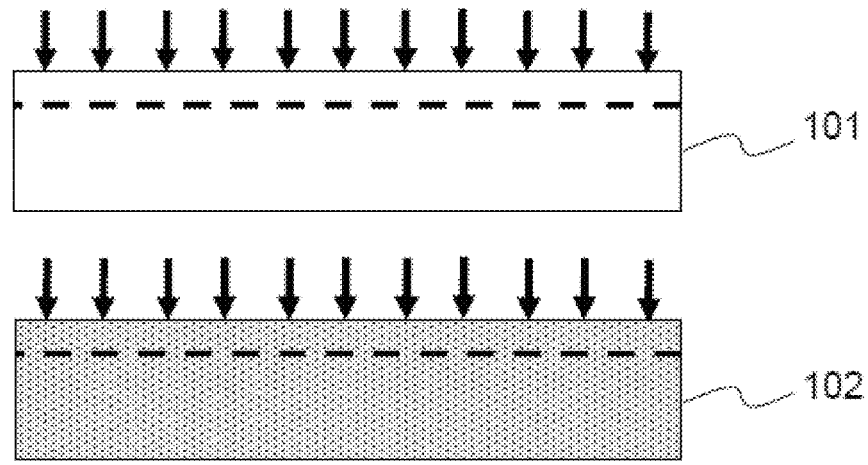
FIG. 8A illustrates a step of a seventh variant of a process according to the invention.

A production process, making use both of the present invention and of that of FR3076126, may therefore take the following form:

Step 7.1:
Light ions are implanted into two lithium-niobate substrates 101 and 102 as illustrated in FIG. 8A.

Figure 8B:
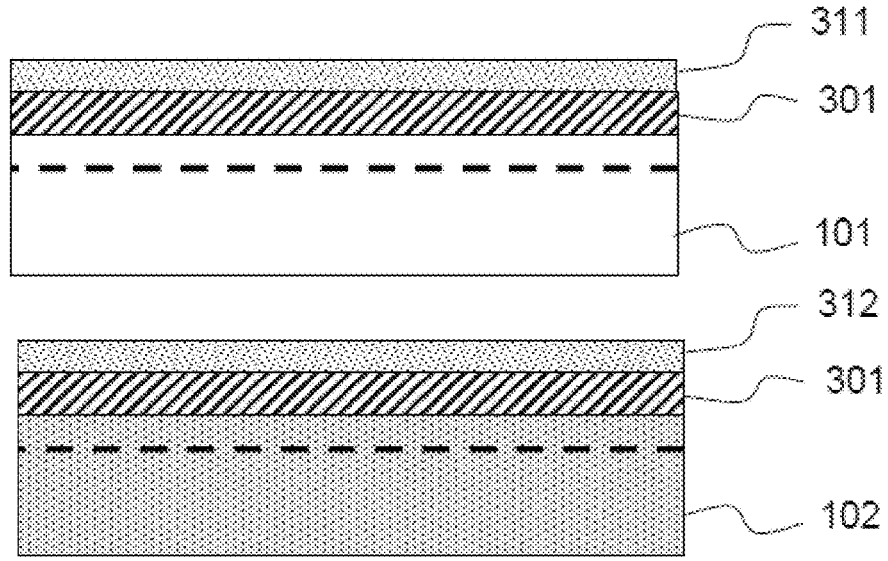
FIG. 8B illustrates a step of a seventh variant of a process according to the invention.

Step 7.2:
On the first donor substrate 101 and on the second donor substrate 102, a fragile separating interface region is produced, and a bonding layer made of $SiO_2$ is deposited and planarized, as illustrated in FIG. 8B; these fragile separating interface regions, 301/311 and 302/312 respectively, will allow the temporary substrates to be detached.

Figure 8C:
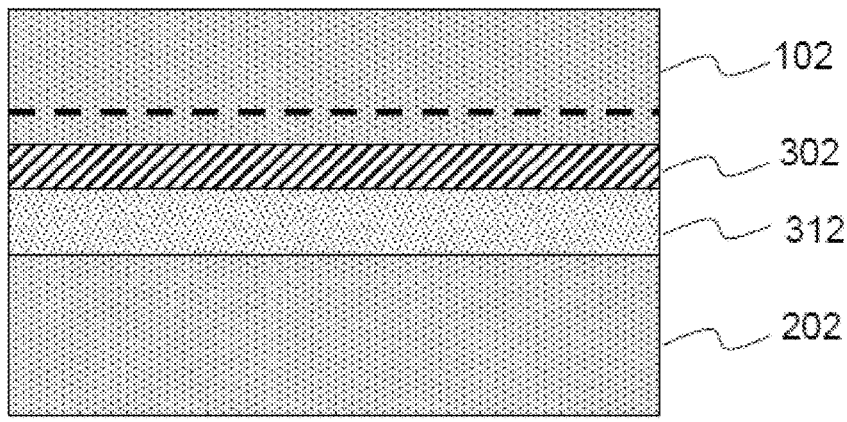
FIG. 8C illustrates a step of a seventh variant of a process according to the invention.
Figure 8C:
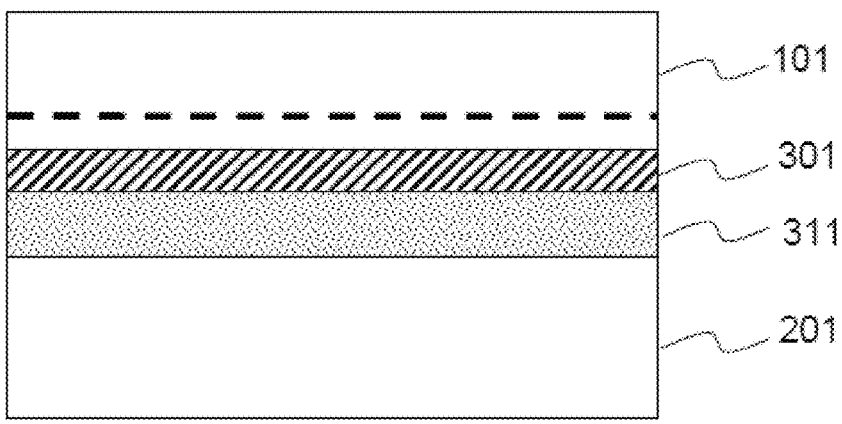

Step 7.3:
The donor substrates 101 and 102 are joined by bonding to temporary substrates 201 and 202, as illustrated in FIG. 8C.

Figure 8D:
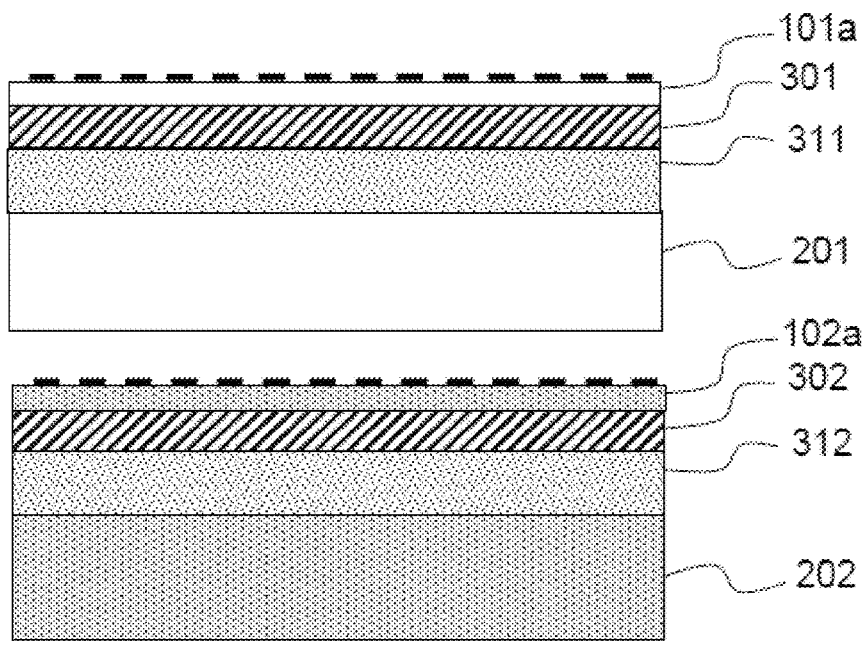
FIG. 8D illustrates a step of a seventh variant of a process according to the invention.
Figure 8E:
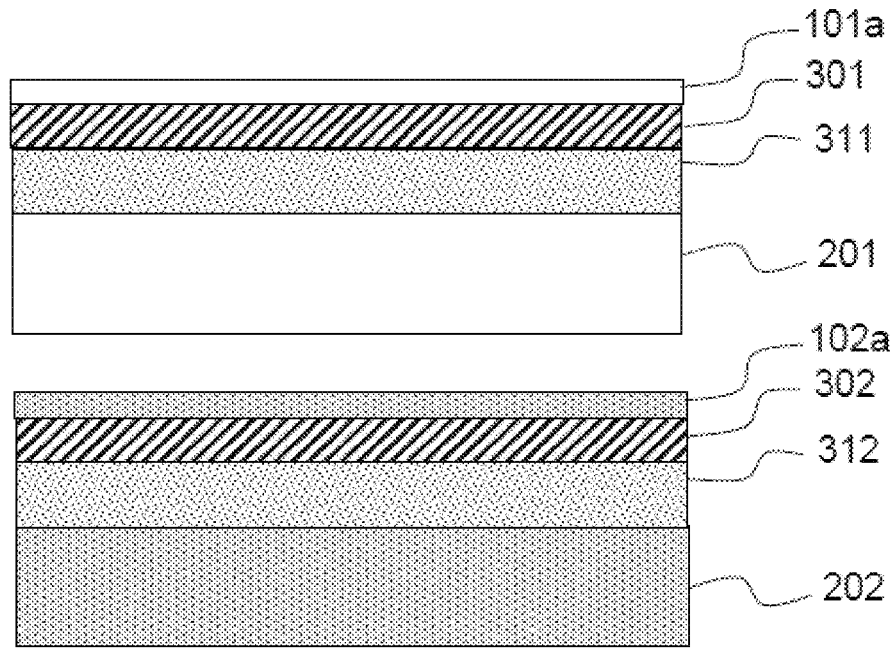
FIG. 8E illustrates a step of a seventh variant of a process according to the invention.

Step 7.4:
Lithium-niobate layers are split and detached in order to produce the layers 101a and 102a as illustrated in FIG. 8D.

Step 7.5:
Operations in which the lithium-niobate layers are subjected to healing anneals, polishing and adjustment of their thicknesses are carried out as illustrated in FIG. 8D.

Figure 8F:
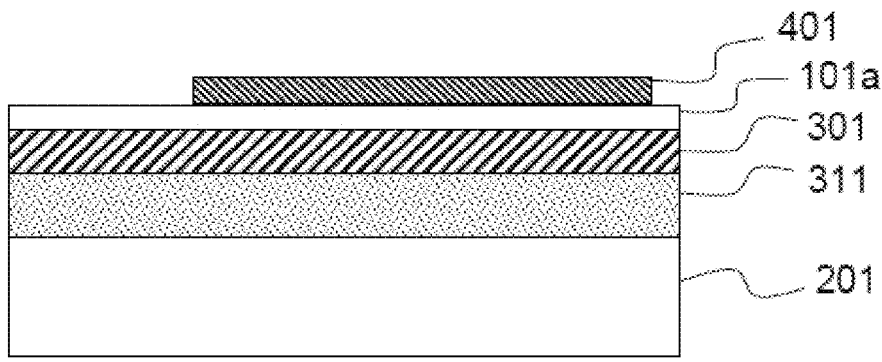
FIG. 8F illustrates a step of a seventh variant of a process according to the invention.

Step 7.6:
A lower electrode 401 (which is for example made of Al deposited by sputtering at a temperature of 400° C.) is deposited and structured on the surface of the lower piezoelectric layer 101a as illustrated in FIG. 8F.

Figure 8G:
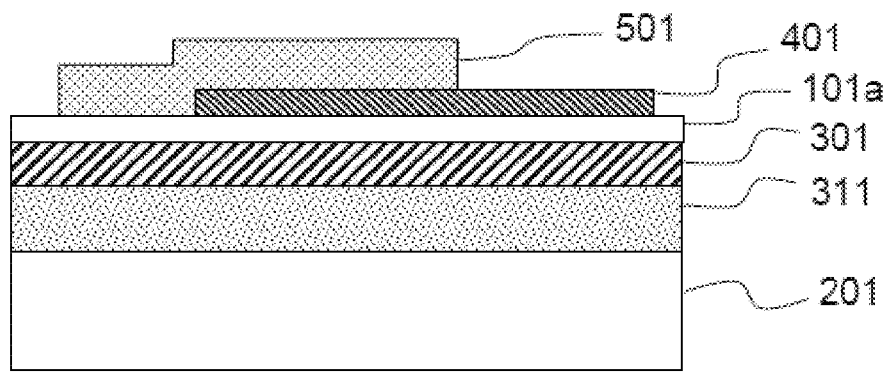
FIG. 8G illustrates a step of a seventh variant of a process according to the invention.

Step 7.7:
A layer of amorphous silicon 501 is deposited and operations of photolithography, etching and resist removal are carried out in order to form a well of sacrificial layer as illustrated in FIG. 8G.

Figure 8H:
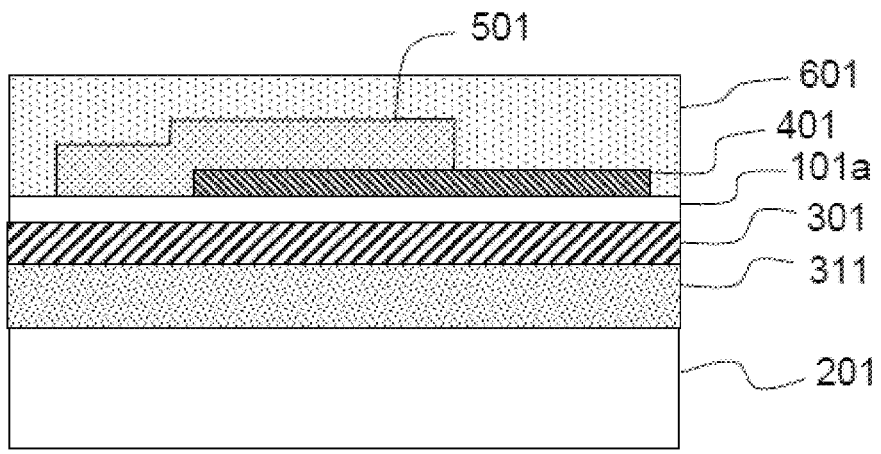
FIG. 8H illustrates a step of a seventh variant of a process according to the invention.

Step 7.8:
The ultimate bonding layer 601, which may be made of silicon oxide, is deposited, as illustrated in FIG. 8H.

Figure 8I:
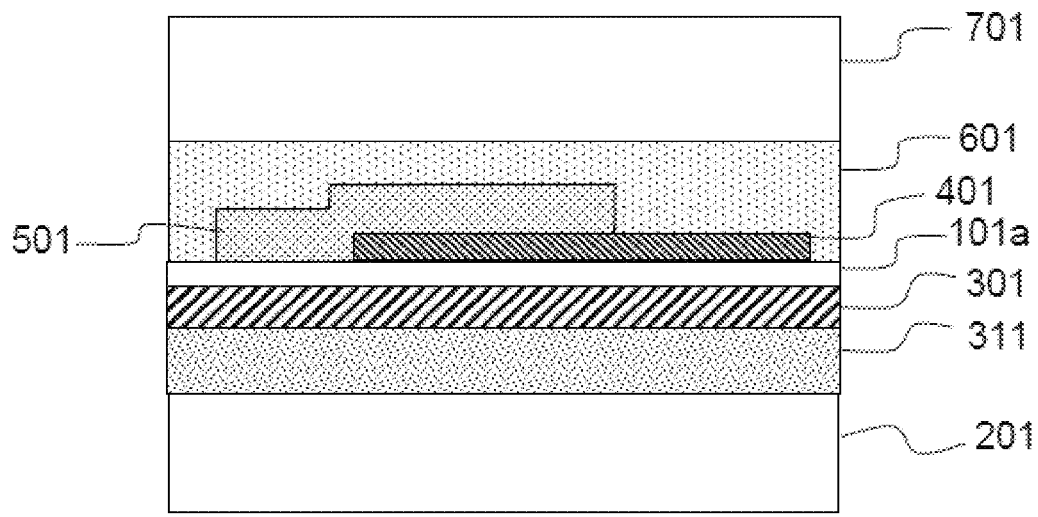
FIG. 8I illustrates a step of a seventh variant of a process according to the invention.

Step 7.9:
The first temporary substrate 201 is bonded to the ultimate substrate 701, in the present case made of thermally oxidized silicon. After surface activation, direct $SiO_2/SiO_2$ bonding may be carried out as illustrated in FIG. 8I.

Figure 8J:
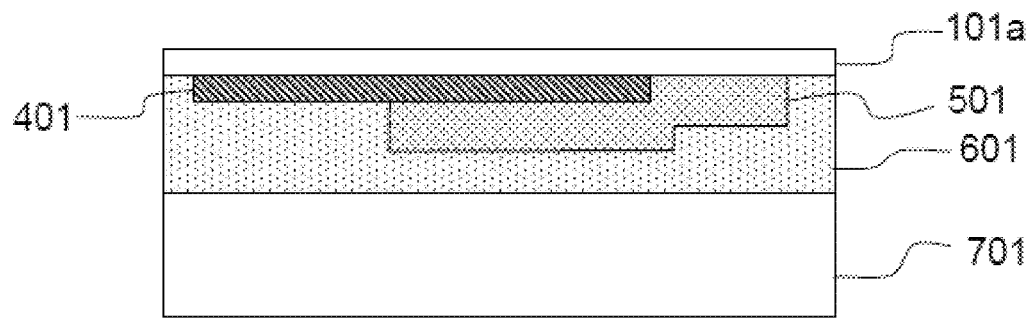
FIG. 8J illustrates a step of a seventh variant of a process according to the invention.

Step 7.10:
The first temporary bond is undone by inserting a blade, in order to leave bare the surface of the layer of interest 101a, as illustrated in FIG. 8J.

Figure 8K:
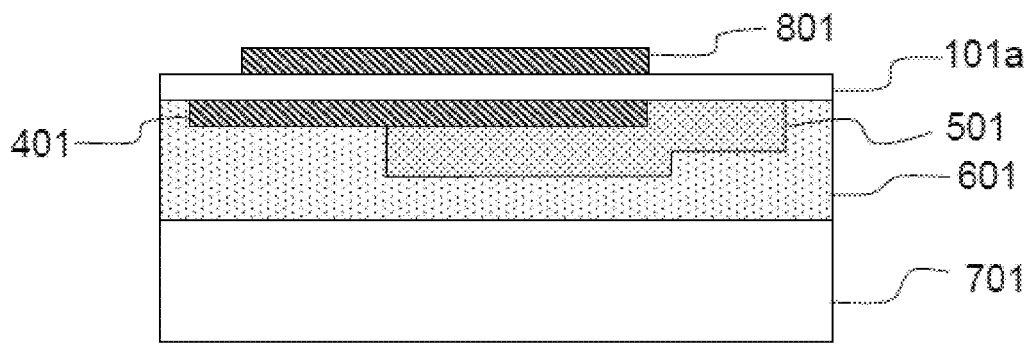
FIG. 8K illustrates a step of a seventh variant of a process according to the invention.

Step 7.11:
Metal (for example Al deposited by sputtering at a temperature of 400° C.) is deposited and the upper electrode 801 of the first piezoelectric layer 101a structured, as illustrated in FIG. 8K.

Figure 8L:
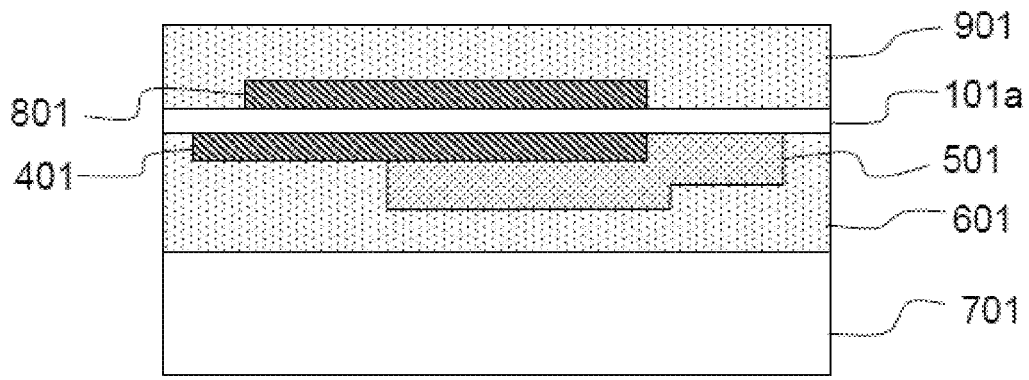
FIG. 8L illustrates a step of a seventh variant of a process according to the invention.

Step 7.12:
Depending on the targeted application, an inter-resonator $SiO_2$ isolating or coupling layer 901 is deposited, as illustrated in FIG. 8L.

Figure 8M:
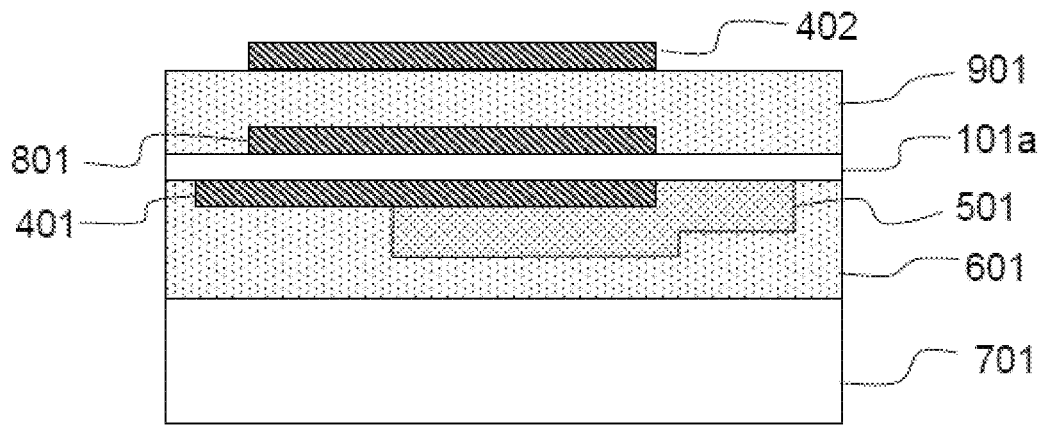
FIG. 8M illustrates a step of a seventh variant of a process according to the invention.

Step 7.13:
Metal (for example, again Al) is deposited and a lower electrode 402 of the upper piezoelectric layer (which will be transferred) is structured, as illustrated in FIG. 8M.

Figure 8N:
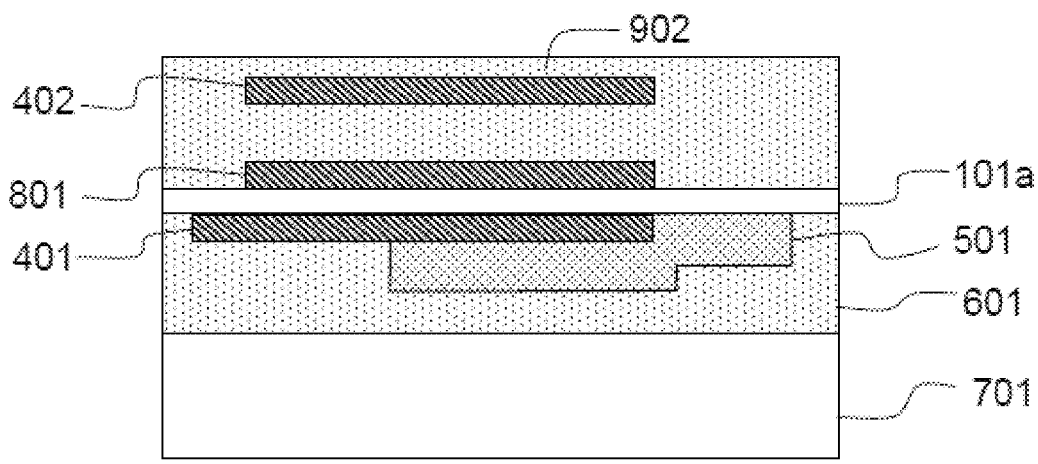
FIG. 8N illustrates a step of a seventh variant of a process according to the invention.

Step 7.14:
A layer 902 of $SiO_2$ is deposited and the step formed by the two electrodes planarized. Only a very small thickness (of the order of 10 to 20 nm) of $SiO_2$ is left above the electrode, as illustrated in FIG. 8N.

Figure 8O:
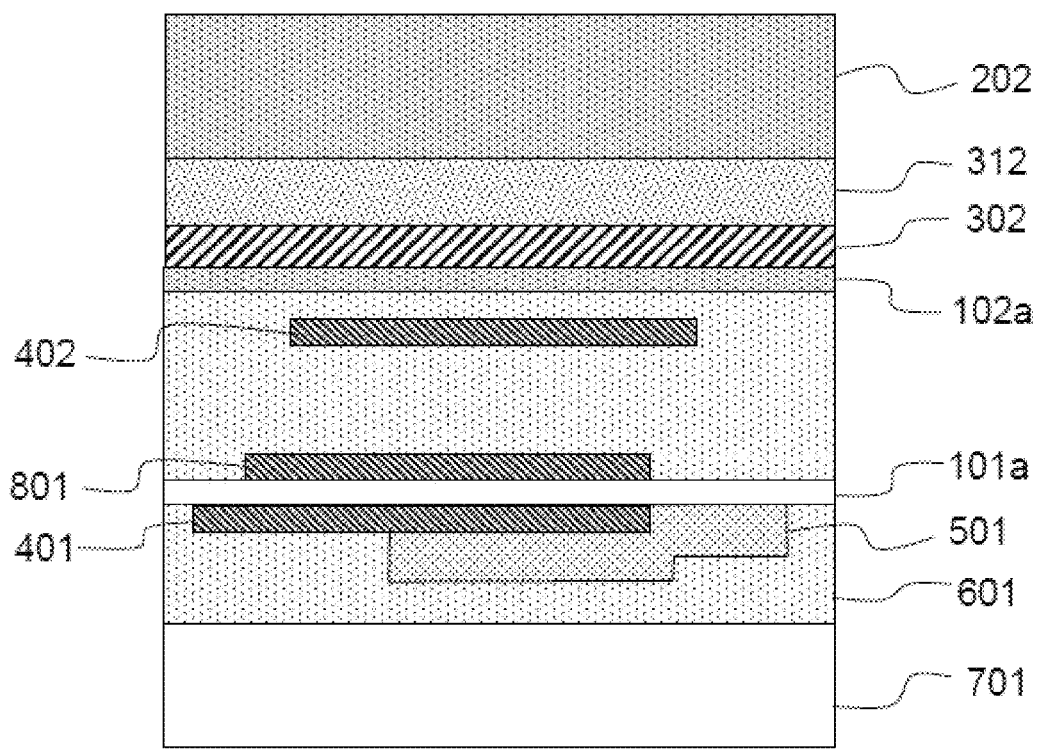
FIG. 8O illustrates a step of a seventh variant of a process according to the invention.

Step 7.15:
A thin layer 302 of $SiO_2$ (of about 10 to 20 nm in thickness) is deposited on the second temporary substrate 202, a fragile separating interface region (comprising the layer of noble metal 312) is produced, and direct bonding then annealing to consolidate the bond are carried out, as illustrated in FIG. 8O.

Figure 8P:
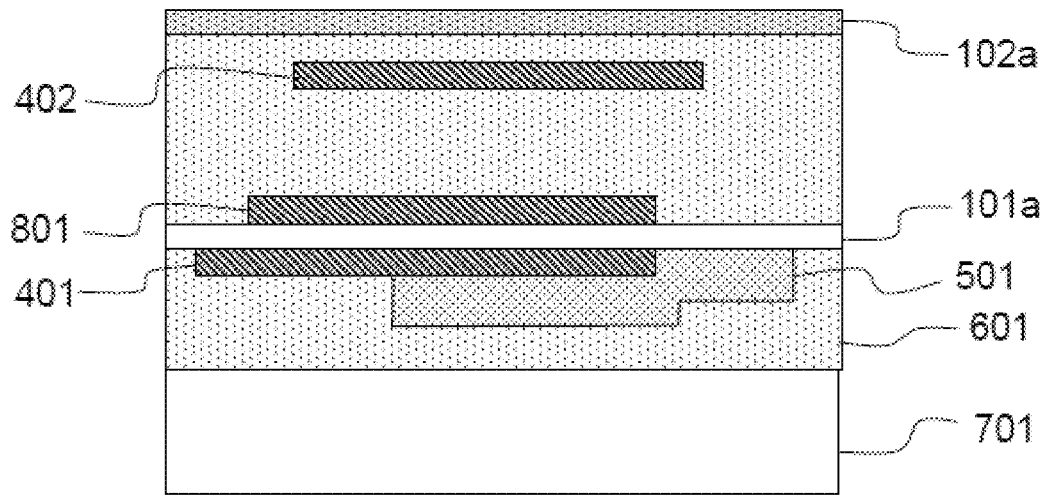
FIG. 8P illustrates a step of a seventh variant of a process according to the invention.

Step 7.16:
An operation of detaching the second temporary substrate 202 is carried out by inserting a blade, in order to leave bare the second layer of interest 102a, as illustrated in FIG. 8P.

Figure 8Q:
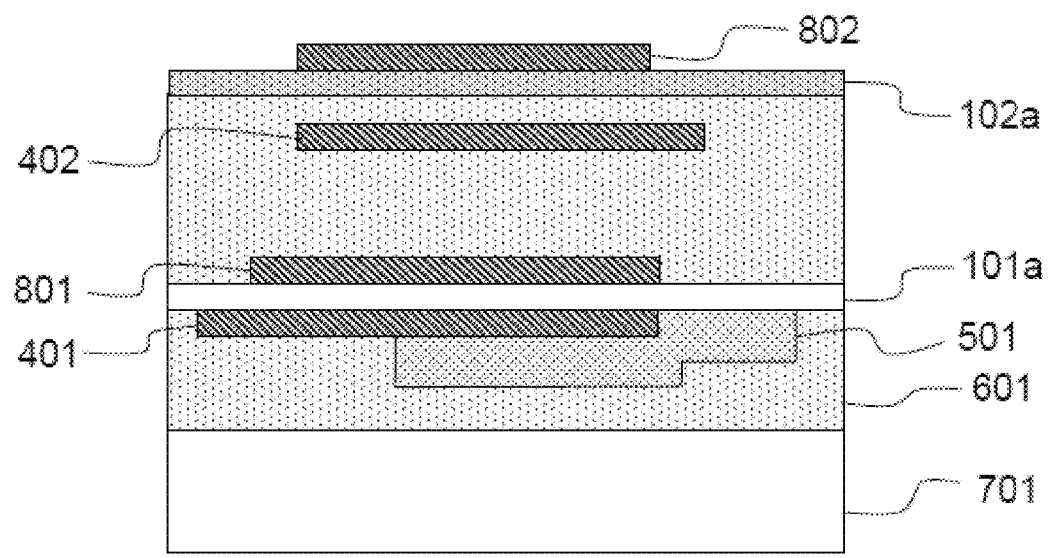
FIG. 8Q illustrates a step of a seventh variant of a process according to the invention.

Step 7.17:
Deposition and an operation of defining the fourth electrode level 802, which may be made of Al, are carried out, as illustrated in FIG. 8Q.

Figure 8R:
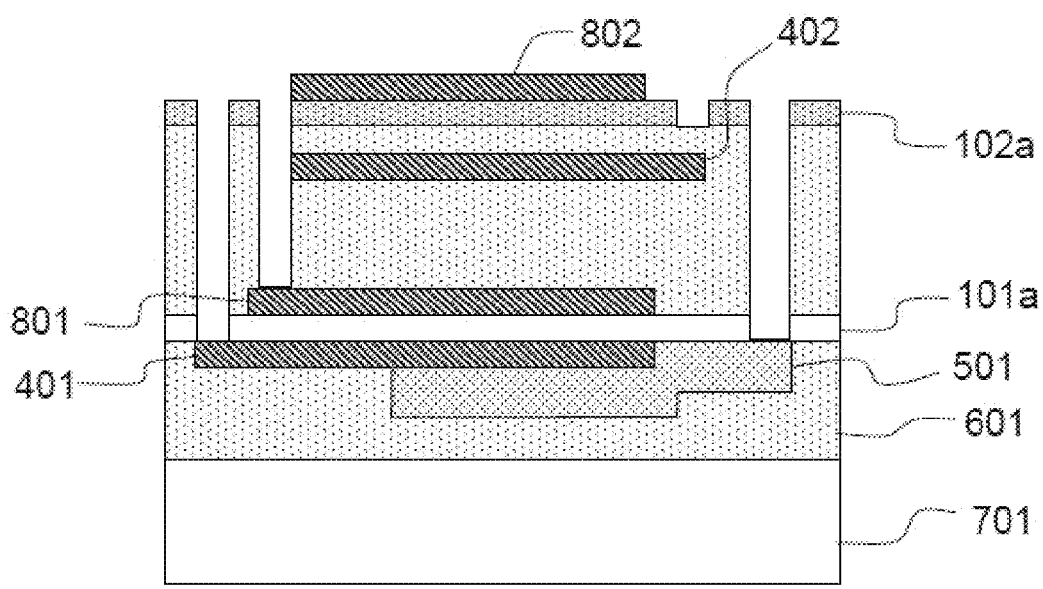
FIG. 8R illustrates a step of a seventh variant of a process according to the invention.

Step 7.18:
Operations in which the various layers are successively etched to form apertures allowing redistribution of electrical contacts to the various electrode levels are carried out, and releasing apertures that open into the wells of amorphous silicon 501 are produced, as illustrated in FIG. 8R.

Figure 8S:
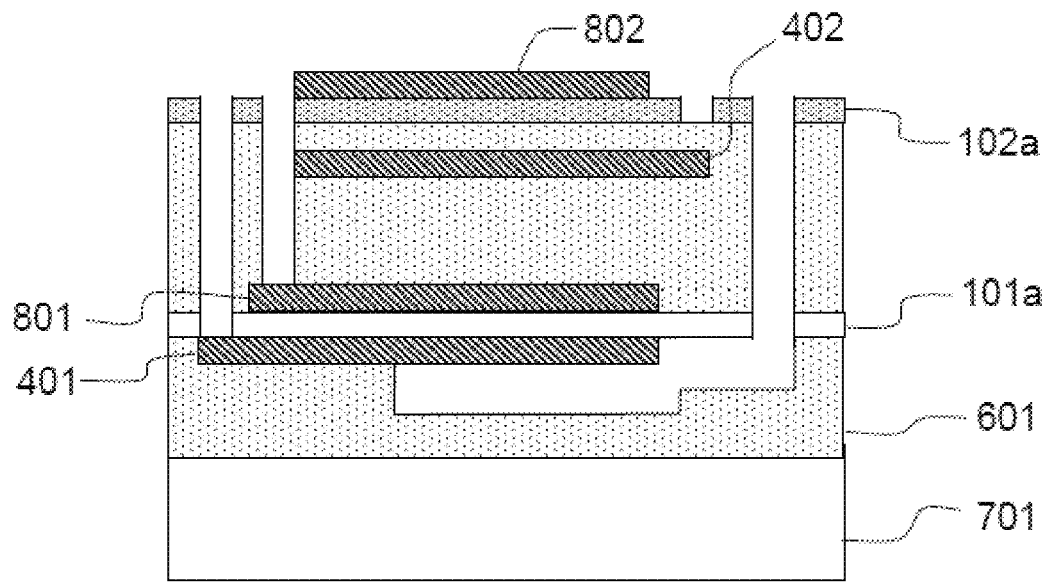
FIG. 8S illustrates a step of a seventh variant of a process according to the invention.

Step 7.19:
The resonators are released by etching the wells of amorphous silicon in gaseous $XeF_2$, as illustrated in FIG. 8S, which shows the two resonators with their layer of interest 101a and 102a comprised between the electrodes 401 and 801 and 402 and 802, respectively.

The present invention may also be applied in the context of a thicker layer of piezoelectric or pyroelectric or ferroelectric material, or in the context of at least two layers of such materials with nevertheless different natures of materials. In this context, provision is advantageously made for an intermediate growth step, just after the obtainment of the thin layer of material of interest after the splitting operation.

In this context, the Applicant describes below an eighth variant of the invention, regarding one of the embodiments described above and incorporating a step of piezoelectric-film regrowth.

The embodiments described above use thin single-crystal piezoelectric films obtained using the "Smart Cut" (or "crystal ion slicing") process and the thickness of which is smaller than 1 µm. The thickness of the piezoelectric film is mainly dictated by the implantation energy. For example, for an implantation energy of 220 keV (160 keV), the thickness obtained for $LiNbO_3$ ($LiTaO_3$) is 600-750 nm (700-900 nm).

Nevertheless, the applications cited above (pyroelectric sensors, bulk-acoustic-wave resonators, surface-acoustic-wave resonators, plate-wave resonators, energy harvesting, electro-optical modulators, etc.) may require the use of thin single-crystal films having film thicknesses comprised between 1 and 10 µm. There are at the present time no industrial techniques that allow thin single-crystal films having thicknesses comprised between 1 and 10 µm and incorporating functional buried layers, patterned electrodes and/or a sacrificial layer to be obtained.

This embodiment is based on the insertion of a step of depositing material of same or similar nature (in terms of chemical nature, crystal structure and coefficient of expansion) as the layer of material transferred using the Smart Cut™ process between steps 1.7 (healing anneal, then polishing of the transferred layer and adjustment of its thickness, or, vice versa, polishing of the transferred layer, adjustment of its thickness and healing anneal) and 1.8 (deposition (by sputtering) of the lower electrode (which is for example made of aluminium), photolithography and etching (for example chemical etching) of the metal layer, and resist removal) of the first variant of the invention. The growth is then homoepitaxial and the layer transferred using the "Smart Cut" process (<1 μm) will act as a seed for the layer obtained by deposition (thickness comprised between 0.01 and 5 μm). The deposited layer may then adopt the same structure as the layer transferred using the "Smart Cut" process. Regrowth of a deposited layer thus allows a layer of material, the thickness of which may be comprised between 0.5 and 5 μm, to be obtained.

Lastly, it will be noted that the present invention is not limited to the case of (alkali-metal)-niobate piezoelectric materials and may be generalized to other families of materials such as the nitrides (AlN, GaN), GaAs, Ge, etc.

An Example of a Process According to this Eighth Variant:

The first steps are for example similar to steps 1.1 to 1.7 described above.

Figure 9A:
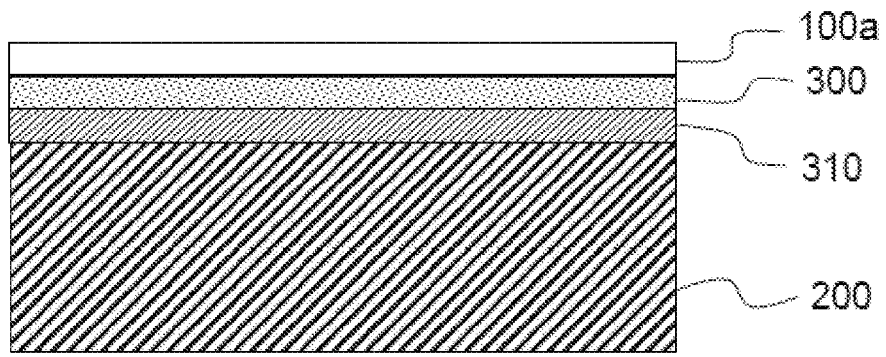
FIG. 9A illustrates a step of an eighth variant of a process according to the invention.

Step 8.1:

Operations are carried out in which a transferred layer of lithium niobate "LNO" is subjected to a healing anneal, then polishing, and then adjustment of its thickness, or, vice versa, the transferred layer is polished, its thickness adjusted and a healing anneal carried out, as illustrated in FIG. 9A, which shows a temporary substrate 200, a fragile separating interface layer 300, an oxide layer 310, and the layer of first material of interest 100a: the LNO layer.

Figure 9B:
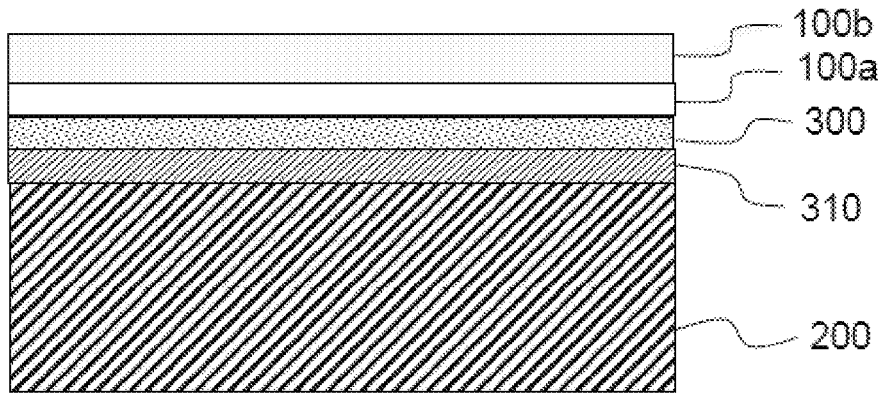
FIG. 9B illustrates a step of an eighth variant of a process according to the invention.

Step 8.2:

A second layer of interest 100b, which may be a layer of LiTaO$_3$, is deposited. The thickness of the layer is comprised between 0.1 and 5 μm. Said layer may be deposited by laser ablation (PLD—pulsed laser deposition), preferably at deposition temperatures comprised between 500 and 700° C., as illustrated in FIG. 9B.

Figure 9C:
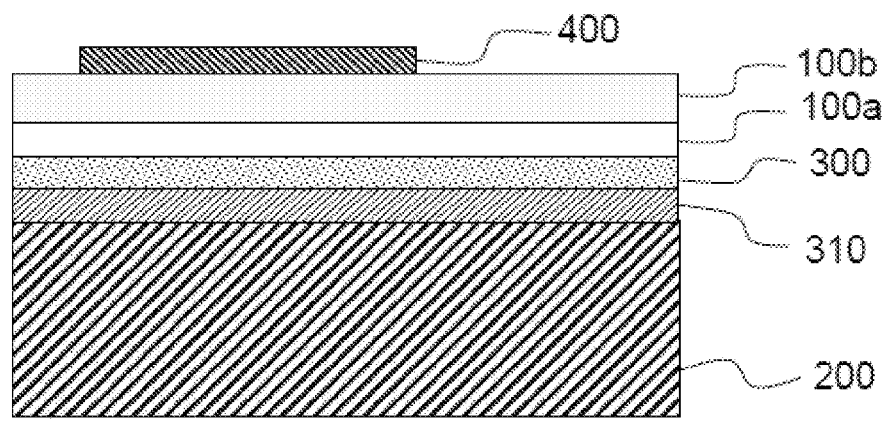
FIG. 9C illustrates a step of an eighth variant of a process according to the invention.

Step 8.3:

The lower electrode 400 (which is for example made of aluminium) is deposited (by sputtering) and photolithography and etching (chemical etching for example) of the metal layer are carried out and the resist removed, as illustrated in FIG. 9C.

Figure 9D:
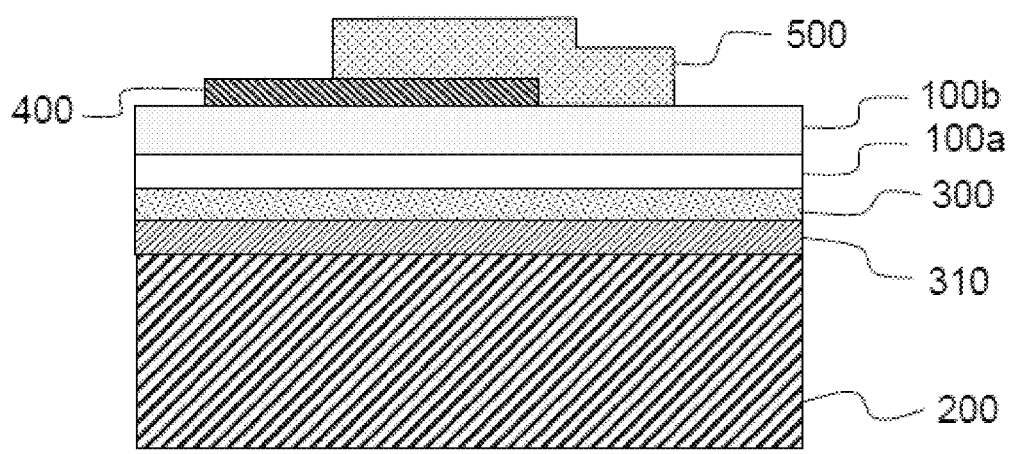
FIG. 9D illustrates a step of an eighth variant of a process according to the invention.

Step 8.4:

The following are then carried out: deposition of a sacrificial layer 500, which is for example made of amorphous silicon, then operations of photolithography, reactive-ion etching and resist removal, in order to define releasing wells, as illustrated in FIG. 9D.

Figure 9E:
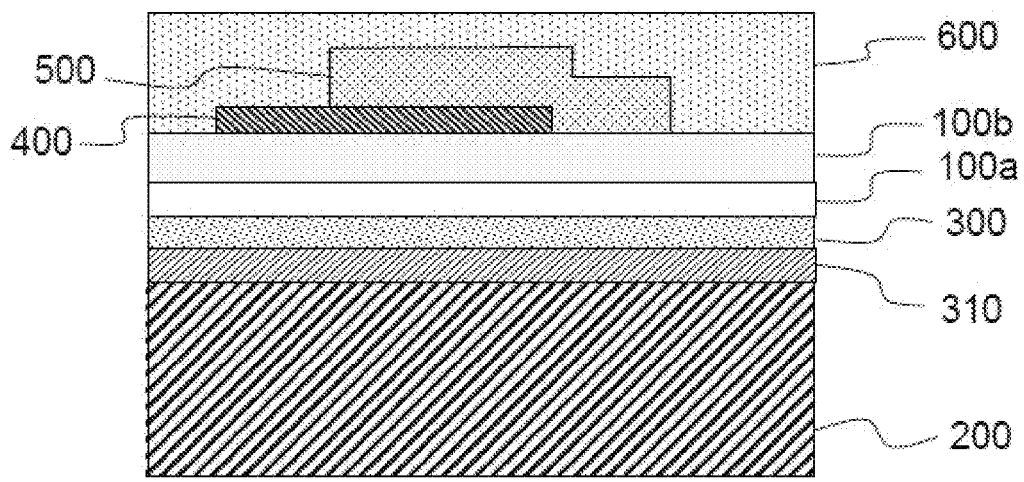
FIG. 9E illustrates a step of an eighth variant of a process according to the invention.

Step 8.5:

A bonding layer 600 is deposited with a view to bonding the ultimate substrate, as illustrated in FIG. 9E.

Figure 9F:
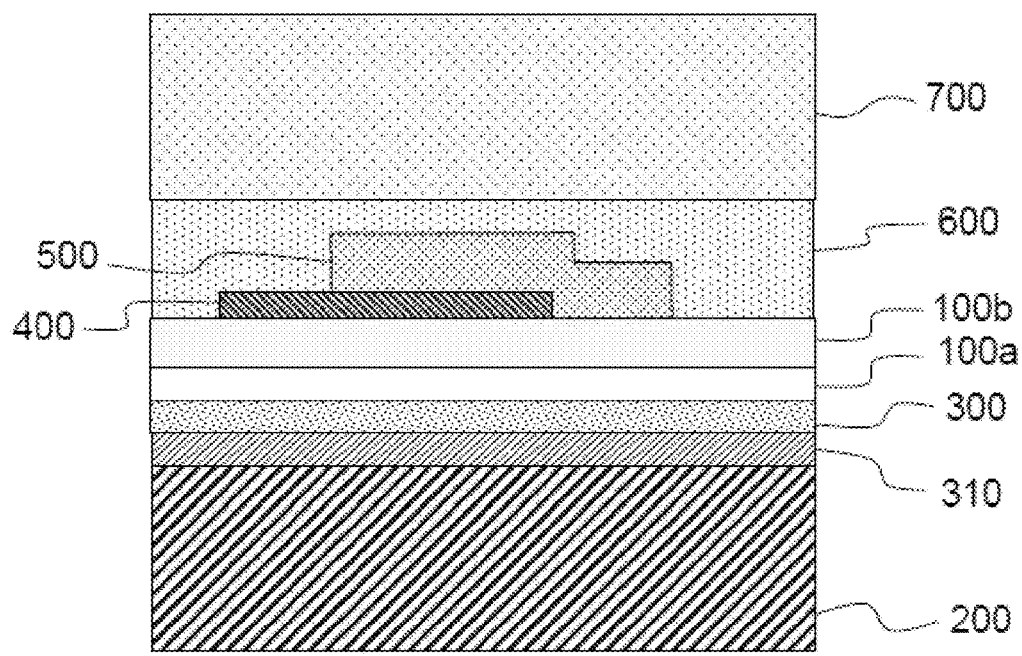
FIG. 9F illustrates a step of an eighth variant of a process according to the invention.

Step 8.6:

A second bonding operation, in which the temporary substrate 200 is bonded to the ultimate substrate 700, is carried out. In this example, the process used is the same as that used to form the first bond. To avoid the effects of differential expansion, an ultimate substrate made of lithium niobate, and of the same crystal orientation as that of the temporary substrate, is used, as illustrated in FIG. 9F.

Figure 9G:
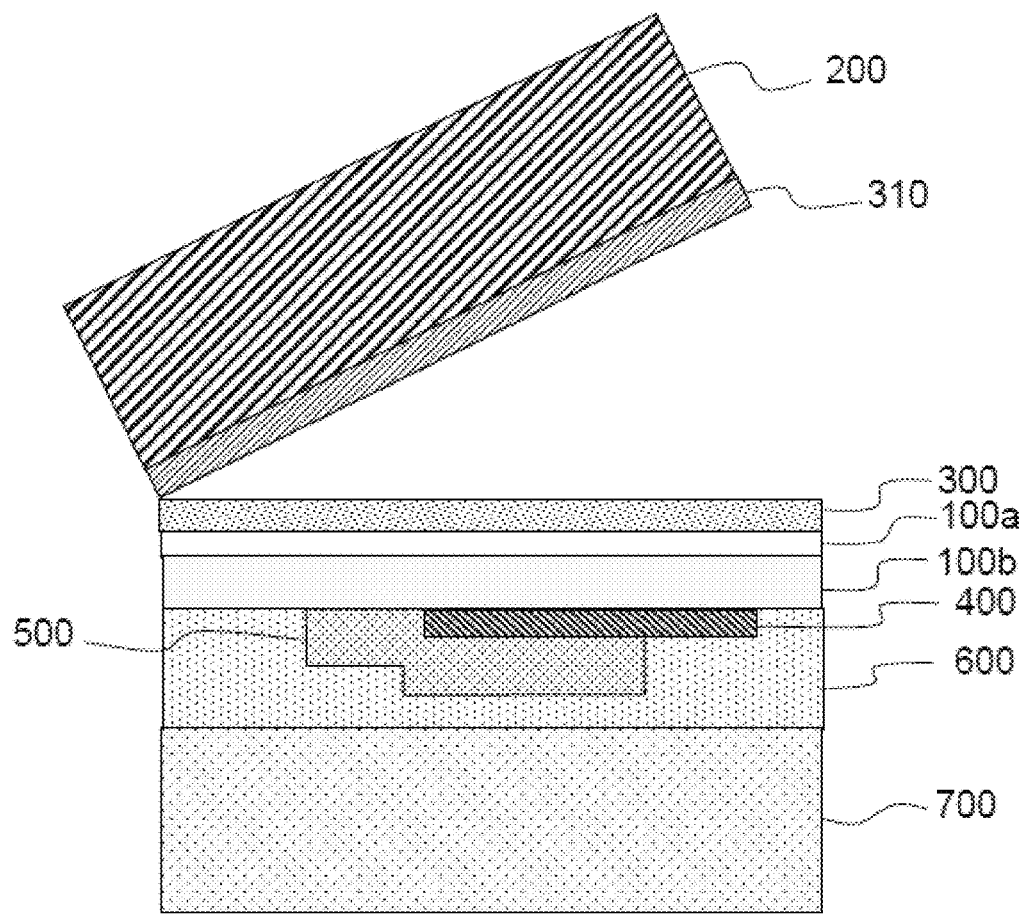
FIG. 9G illustrates a step of an eighth variant of a process according to the invention.

Step 8.7:

Debonding (detachment) is achieved by inserting a blade at the fragile interface comprising the layer 300, as illustrated in FIG. 9G.

Figure 9H:
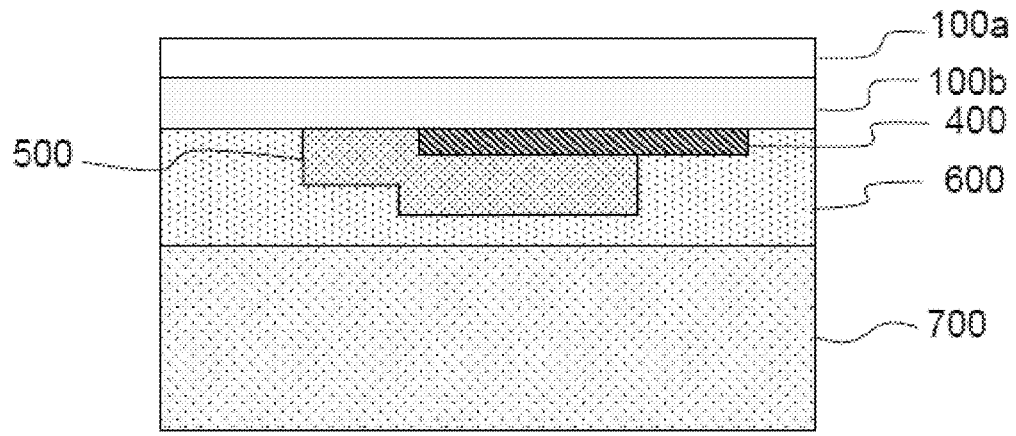
FIG. 9H illustrates a step of an eighth variant of a process according to the invention.

Step 8.8:

The layer of the fragile interface made of noble metal 300, which in the present case is Pt, is removed by dry etching and the oxide is removed in HF, as illustrated in FIG. 9H, leaving bare the layer of interest 100a.

Figure 9I:
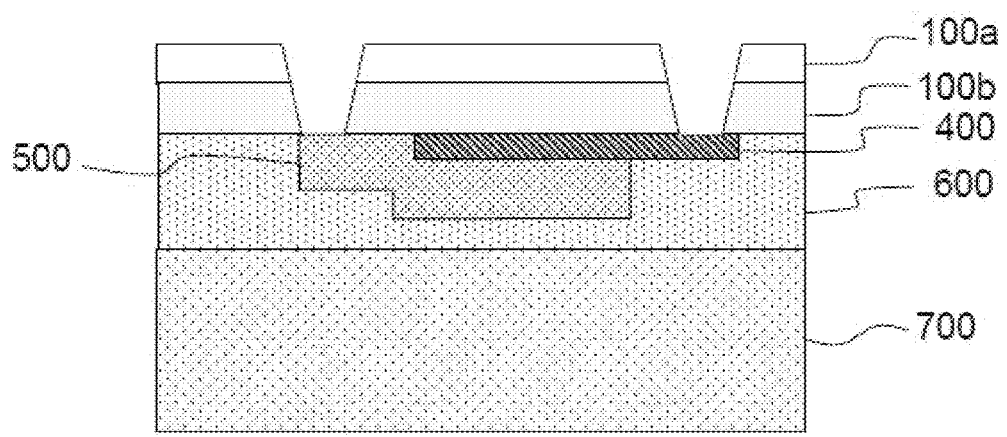
FIG. 9I illustrates a step of an eighth variant of a process according to the invention.

Steps that are the same as those presented with respect to the prior art are then carried out:

Step 8.9:

Apertures are etched in the transferred lithium-niobate film 100a and in the film 100b (in this example of lithium tantalate), for example by photolithography, ion-beam etching (IBE) and resist removal, as illustrated in FIG. 9I.

Figure 9J:
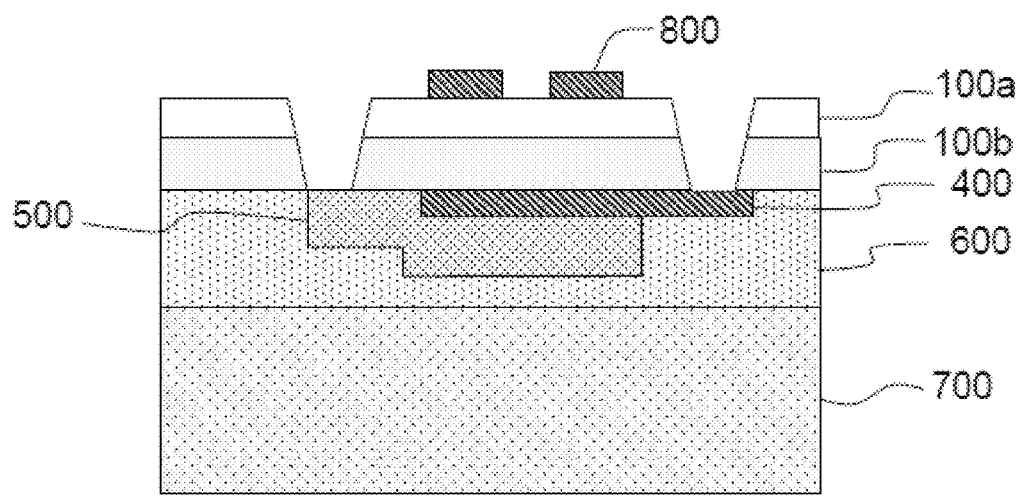
FIG. 9J illustrates a step of an eighth variant of a process according to the invention.

Step 8.10:

Upper electrodes 800, for example made of aluminium, are then formed via deposition by sputtering, photolithography, wet etching and resist removal as illustrated in FIG. 9J.

Figure 9K:
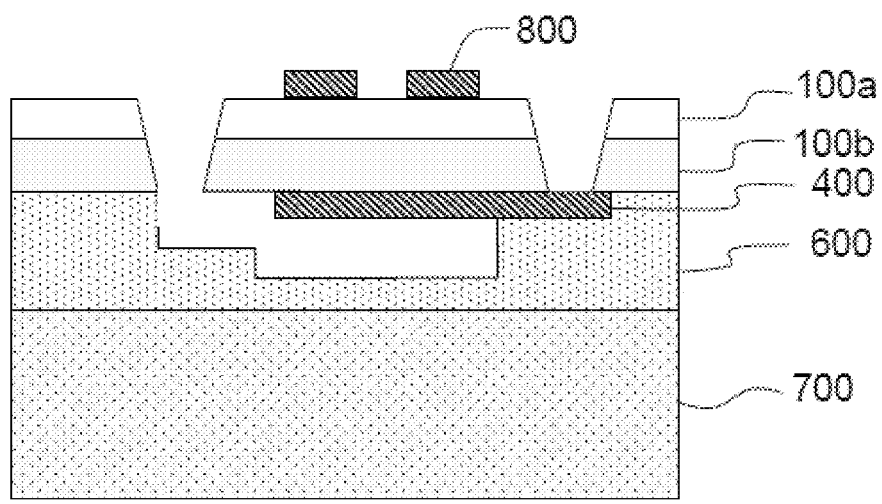
FIG. 9K illustrates a step of an eighth variant of a process according to the invention.

Step 8.11:

The membranes containing the resonators are then released, by etching the wells of sacrificial layer 500 (here using gaseous XeF$_2$ to dissolve the wells, which are made of amorphous silicon), as illustrated in FIG. 9K.

The invention claimed is:

1. A process for fabricating a component comprising transferring an assembly comprising one or more layers of one or more single-crystal piezoelectric or pyroelectric or ferroelectric materials to a final substrate, said process comprising at least:

a first set of steps comprising:
a step of implanting ions into a donor substrate of single-crystal piezoelectric or pyroelectric or ferroelectric material at an implantation level so as to define a layer region in said single-crystal piezoelectric or pyroelectric or ferroelectric material;
a first joining step wherein said donor substrate of single-crystal piezoelectric or pyroelectric or ferroelectric material is joined to a temporary substrate, said first joining step comprising producing a fragile separating interface region between said donor substrate of single-crystal piezoelectric or pyroelectric or ferroelectric material and said temporary substrate, said region comprising at least two layers of different materials in order to ensure two compounds apt to generate an interdiffusion of one or more constituent elements of at least one of the two compounds make contact;
a step of thinning said donor substrate of single-crystal piezoelectric or pyroelectric or ferroelectric material to the implantation level so as to define a layer of single-crystal piezoelectric or pyroelectric or ferroelectric material;
a step of healing residual defects via thermal annealing of said layer of single-crystal piezoelectric or pyroelectric or ferroelectric material;
and a second set of steps subsequent to the first set of steps, comprising at least:
a second joining step in which an assembly comprising the one or more layers of one or more single-crystal piezoelectric or pyroelectric or ferroelectric materials and said temporary substrate is joined to a final substrate;
a step of separating the temporary substrate from said layer of single-crystal piezoelectric or pyroelectric or ferroelectric material, via said fragile separating interface region,
wherein production of said fragile separating interface region between said donor substrate of single-crystal piezoelectric or pyroelectric or ferroelectric material and said temporary substrate comprises at least:
producing a layer of oxide or of nitride;
depositing a layer of noble metal;
carrying out a thermal anneal apt to create said interdiffusion of one or more constituent elements of at least one of the two compounds,
wherein the step of separating the temporary substrate is carried out mechanically, via the fragile interface.

2. The fabricating process according to claim 1, wherein the second set of steps comprises a step of producing a first functional structure on one of the layers of single-crystal piezoelectric or pyroelectric or ferroelectric material.

3. The process for fabricating a component according to claim 2 and comprising:
producing a first metal functional structure on a first face of said layer of single-crystal piezoelectric or pyroelectric or ferroelectric material, said structure being configured to be a continuous electrode or a series of discontinuous electrodes;
producing a second metal functional structure on the opposite face of said layer of single-crystal piezoelectric or pyroelectric or ferroelectric material or on an opposite face of another layer of single-crystal piezoelectric or pyroelectric or ferroelectric material, said structure being configured to be a continuous electrode or a series of discontinuous electrodes, said first face corresponding to the thinned face of the donor substrate of single-crystal piezoelectric or pyroelectric or ferroelectric material.

4. The fabricating process according to claim 1, wherein the second set of steps comprises a step of producing a second functional structure on one of the layers of single-crystal piezoelectric or pyroelectric or ferroelectric material.

5. The fabricating process according to claim 1, wherein, after the step of thinning said donor substrate, which is made of a first single-crystal piezoelectric or pyroelectric or ferroelectric material, to the implantation level, so as to define a layer of single-crystal piezoelectric or pyroelectric or ferroelectric material, said process comprises producing an additional layer of second single-crystal piezoelectric or pyroelectric or ferroelectric material on the surface of said layer of single-crystal piezoelectric or pyroelectric or ferroelectric material, said first and second materials being identical or different.

6. The fabricating process according to claim 5, wherein the thickness of the layer of first material is smaller than or equal to 1 micron, and the thickness of the additional layer of second material is comprised between 0.1 and 5 microns.

7. The fabricating process according to claim 1, comprising:
producing a layer of silicon oxide or of silicon nitride;
depositing a layer of noble metal of Pt or of Au or of Rh or of Os or of Pd or of Ru or of Ir.

8. The fabricating process according to claim 1, wherein the step of healing residual defects via thermal annealing is carried out with a thermal budget apt to cause the diffusion of the noble metal into the oxide or into the nitride, said thermal budget being spent at a temperature comprised between 300° C. and 700° C. for a time comprised between 1 hour and 10 hours.

9. The fabricating process according to claim 1, wherein the first joining step, wherein step said substrate of single-crystal piezoelectric or pyroelectric or ferroelectric material is joined to a temporary substrate, is carried out with a first bonding layer made of a constituent material of one of the materials in order to ensure two compounds apt to generate an interdiffusion or one or more constituent elements of at least one of the two compounds make contact.

10. The fabricating process according to claim 1, wherein the first joining step, wherein step said substrate of single-crystal piezoelectric or pyroelectric or ferroelectric material is joined to a temporary substrate, is carried out with a first bonding layer, said first bonding layer being a layer of silicon oxide ($SiO_2$), a metal layer (Cu, Au, Ti, Ag, etc.) or a layer of a polymer.

11. The fabricating process according to claim 1, wherein the second joining step, wherein step an assembly comprising the one or more layers of one or more single-crystal piezoelectric or pyroelectric or ferroelectric materials and said temporary substrate is joined to a final substrate, is carried out with at least one second bonding layer, said second bonding layer being mineral.

12. The fabricating process according to claim 1, wherein the donor substrate of single-crystal piezoelectric or pyroelectric or ferroelectric material is made of lithium niobate, or lithium tantalate.

13. The fabricating process according to claim 1, wherein the temporary substrate is made of the same material as the donor substrate of single-crystal piezoelectric or pyroelectric or ferroelectric material.

14. The fabricating process according to claim 1, wherein the final substrate is made of lithium niobate, lithium tantalate or silicon or glass or sapphire.

15. The fabricating process according to claim 1, said component being an acoustic wave resonator, said process comprising:
depositing a sacrificial layer on the surface of a layer of single-crystal piezoelectric or pyroelectric or ferroelectric material or on the surface of the additional layer of second single-crystal piezoelectric or pyroelectric or ferroelectric material and/or on the surface of the first metal functional structure;
producing at least one well in said sacrificial layer;
etching said well so as to produce a suspended membrane of single-crystal piezoelectric or pyroelectric or ferroelectric material.

16. The fabricating process according to claim 1, said component being an acoustic-wave resonator, said process comprising producing cavities in said final substrate before the second joining step.

17. The fabricating process according to claim 1, said component being an acoustic-wave resonator, said process comprising producing a stack with, in alternation, layers having different acoustic impedances on the surface of the layer of single-crystal piezoelectric or pyroelectric or ferroelectric material or on the surface of the additional layer of second single-crystal piezoelectric or pyroelectric or ferroelectric material, in order to produce a Bragg-mirror structure.

18. The fabricating process according to claim 1, said component comprising a set of at least two stacked bulk-acoustic-wave resonators, said process comprising:
fabricating a resonator comprising at least a first layer of single-crystal piezoelectric or pyroelectric or ferroelectric material, a first metal functional structure, and a second metal functional structure, on a final substrate;
depositing one or more acoustically coupling or isolating layers on the surface of said first resonator;
producing a first metal functional structure apt to form a first electrode of a second resonator on the surface of said one or more acoustically coupling or acoustically isolating layers;
transferring a second layer of single-crystal piezoelectric or pyroelectric or ferroelectric material previously transferred, to a temporary substrate, via a fragile separating interface region to the surface of said temporary substrate;
removing said temporary substrate so as to leave a second face of said second active layer free;
producing a second metal functional structure, so as to define the second resonator.

19. The fabricating process according to claim 1, said component being a pyroelectric sensor comprising, between two continuous electrodes, an active layer said process further comprises partially etching, from the back side, the final substrate, so as to define a membrane in said final substrate.

20. The fabricating process according to claim 1, wherein the fragile interface region comprises a layer of noble metal and another layer comprising at least one of the following materials:
an oxide;
a nitride;
a silicon oxynitride;
a silicon oxycarbide (SiOC);
SiOF.

* * * * *